(12) United States Patent
Kim et al.

(10) Patent No.: US 11,682,717 B2
(45) Date of Patent: Jun. 20, 2023

(54) MEMORY DEVICE INCLUDING VERTICAL STACK STRUCTURE AND METHOD OF MANUFACTURING THE SAME

(71) Applicant: Samsung Electronics Co., Ltd., Suwon-si (KR)

(72) Inventors: Yumin Kim, Seoul (KR); Doyoon Kim, Hwaseong-si (KR); Seyun Kim, Seoul (KR); Jinhong Kim, Seoul (KR); Soichiro Mizusaki, Suwon-si (KR); Youngjin Cho, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/459,527

(22) Filed: Aug. 27, 2021

(65) Prior Publication Data
US 2022/0310827 A1   Sep. 29, 2022

(30) Foreign Application Priority Data
Mar. 23, 2021   (KR) .......................... 10-2021-0037442

(51) Int. Cl.
*H01L 29/68* (2006.01)
*H01L 27/115* (2017.01)

(52) U.S. Cl.
CPC .......... *H01L 29/685* (2013.01); *H01L 27/115* (2013.01)

(58) Field of Classification Search
CPC combination set(s) only.
See application file for complete search history.

(56) References Cited

U.S. PATENT DOCUMENTS

| | | | |
|---|---|---|---|
| 9,059,395 B2 | 6/2015 | Ju et al. | |
| 9,666,799 B2 | 5/2017 | Yanagida et al. | |
| 2014/0145137 A1* | 5/2014 | Ju | H01L 27/2481 |
| | | | 257/2 |
| 2020/0006433 A1 | 1/2020 | Majhi et al. | |

OTHER PUBLICATIONS

Jung Ho Yoon, et. Al. "Highly Uniform, Electroforming-Free, and Self-Rectifying Resistive Memory in the Pt/Ta2O5/HfO2-x/TiN Structure," Advanced Functional Materials, vol. 24, pp. 5086-5095 (2014).

* cited by examiner

*Primary Examiner* — Moin M Rahman
*Assistant Examiner* — Mohammad A Rahman
(74) *Attorney, Agent, or Firm* — Harness, Dickey & Pierce, P.L.C.

(57) ABSTRACT

Disclosed are a memory device including a vertical stack structure and a method of manufacturing the memory device. The memory device includes an insulating structure having a shape including a first surface and a protrusion portion protruding in a first direction from the first surface, a recording material layer covering the protrusion portion along a protruding shape of the protrusion portion and extending to the first surface on the insulating structure a channel layer on the recording material layer along a surface of the recording material layer, a gate insulating layer on the channel layer, and a gate electrode formed at a location on the gate insulating layer to face a second surface which is a protruding upper surface of the protrusion portion, wherein a void exists between the gate electrode and the insulating structure, defined by the insulating structure and the recording material layer.

20 Claims, 34 Drawing Sheets

//<br>
MEMORY DEVICE INCLUDING VERTICAL STACK STRUCTURE AND METHOD OF MANUFACTURING THE SAME

CROSS-REFERENCE TO RELATED APPLICATION

This application is based on and claims priority under 35 U.S.C. § 119 to Korean Patent Application No. 10-2021-0037442, filed on Mar. 23, 2021, in the Korean Intellectual Property Office, the disclosure of which is incorporated by reference herein in its entirety.

BACKGROUND

Some example embodiments relate to memory devices, and more particularly, to memory devices including a structure in which a plurality of memory cells are vertically stacked, and/or methods of manufacturing the memory devices.

Semiconductor devices may be classified into memory devices and logic devices. A memory device is or includes a device for storing data. In general, semiconductor memory devices may be broadly classified into volatile memory devices and nonvolatile memory devices. A volatile memory device is or includes a memory device from which stored data is erased when power supply is stopped. Examples include dynamic random access memory (DRAM), static random access memory (SRAM), etc. In addition, a non-volatile memory device is or includes a memory device from which stored data is not erased even when power supply is stopped. Examples include, programmable read-only memory (PROM), erasable PROM (EPROM), electrically EPROM (EEPROM), flash memory device, etc.

Also, in recent years, in line with the trend of higher performance and/or lower power of semiconductor memory devices, next-generation semiconductor memory devices, such as magnetic RAM (MRAM), phase change RAM (PCRAM), and resistive RAM (ReRAM) have been developed. Materials included in these next-generation semiconductor memory devices have a characteristic in that their resistance values vary according to current, voltage, or heat, and the resistance value is maintained and unchanged even when the supply of current or voltage is stopped. In order to overcome the limitation of VNAND that is gradually approaching an allowable height limit in chip packaging, these memories have been studied in the form of vertical structures. Thus, there is a need or a desire to study a method for scaling a unit cell.

SUMMARY

Provided are memory devices including a vertical stack structure capable of securing a stable memory operation.

Alternatively or additionally, provided are memory devices including a vertical stack structure capable of increasing the degree of integration density.

Alternatively or additionally, provided are methods of manufacturing the memory devices.

Alternatively or additionally, provided are electronic apparatuses including the memory devices.

Additional aspects will be set forth in part in the description which follows and, in part, will be apparent from the description, or may be learned by practice of example embodiments.

According to some example embodiments, a memory device includes an insulating structure having a shape including a first surface and a protrusion portion protruding from the first surface in a first direction, a recording material layer covering the protrusion portion along a protruding shape of the protrusion portion and extending to the first surface on the insulating structure, a channel layer on the recording material layer along a surface of the recording material layer, a gate insulating layer on the channel layer, and a gate electrode on the gate insulating layer, the gate electrode at a location to face a second surface which is an upper surface of the protrusion portion. A void exists between the gate electrode and the insulating structure and is defined by the insulating structure and the recording material layer.

A length from the first surface to the second surface in the first direction may be about 5 nm or more.

The first surface and the second side may be parallel to each other.

The recording material layer may include a variable resistance material.

The recording material layer may include at least one of $Rb_2O$, $TiO_2$, $BaO$, $ZrO_2$, $CaO$, $HfO_2$, $SrO$, $Sc_2O_3$, $MgO$, $Li_2O$, $Al_2O_3$, $SiO_2$, $BeO$, $Sc_2O_3$, $Nb_2O_5$, $NiO$, $Ta_2O_5$, $WO_3$, $V_2O_5$, $La_2O_3$, $Gd_2O_3$, $CuO$, $MoO_3$, $Cr_2O_3$, and $MnO_2$.

The recording material layer may include a phase change material.

The recording material layer may include $Ge_2Sb_2Te_5$.

The recording material layer may have a thickness in a range from about 0.5 nm to about 30 nm.

The protrusion portion includes a plurality of the protrusions at constant intervals in a second direction perpendicular to the first direction, and a plurality of gate electrodes on the insulating structure. The gate electrode is one of the plurality of gate electrodes, the plurality of gate electrodes face the plurality of protrusions, and are spaced apart from each other in the second direction.

A length of the gate electrode in the second direction may be in a range from about 5 nm to about 30 nm.

A distance between adjacent gate electrodes among the plurality of gate electrodes may be in a range from about 5 nm to about 30 nm.

The memory device may further include a separating layer between the plurality of gate electrodes.

A region of the recording material layer may include a plurality of switching regions each facing the plurality of gate electrodes, each of the plurality of switching regions may have both ends in the second direction, and the both ends of the plurality of switching regions may each contact the channel layer.

An electrical separation distance between adjacent switching regions among the plurality of switching regions may be greater than a physical separation distance between the adjacent switching regions.

When or in response to the sum of a protrusion length of the protrusion portion and a length of the void in a direction of the protrusion portion being $D_r$, the electrical separation distance may be greater than the physical separation distance by $2D_r$.

The length of the switching region in the second direction may be less than the length of the gate electrode in the second direction.

The insulating structure may have a shape in which the plurality of protrusions surround a cylindrical surface of a cylinder with a width and protrude in a radial direction on the cylindrical surface of the cylinder, wherein a length direction of the cylinder is the second direction.

One of both ends of the recording material layer and the channel layer in the second direction may be connected to a common source line, and the other end may be connected to a bit line, and the plurality of gate electrodes may be connected to a plurality of word lines, respectively.

In one example, the insulating structure may exist only at one end of the recording material layer without a protrusion portion, and the void may extend to an entire inner region surrounded by the recording material layer.

According to some example embodiments, an electronic device includes a memory device described above.

According to some example embodiments, a method of manufacturing a memory device is provided, the method includes forming a stack structure by alternately and repeatedly depositing a sacrificial layer and a separating layer on a substrate, forming a channel hole penetrating through the stack structure, removing a portion of the sacrificial layer such that an inner surface of the channel hole has a concave-convex shape in a first direction perpendicular to a stacking direction of the stack structure, sequentially forming a gate insulating layer, a channel layer, and a recording material layer on the inner surface of the channel hole, depositing an insulating material inside the channel hole, forming a gate hole by removing all remaining portions of the sacrificial layer, and depositing an electrode material in the gate hole, wherein in the depositing of the insulating material, the insulating material is deposited under a condition at which a void is formed between the recording material layer and the insulating material that is being deposited.

The method may further include, after forming the gate insulating layer and the channel layer on the inner surface of the channel hole and before forming the recording material layer, removing an insulating material and a channel material deposited on a bottom surface of the channel hole.

The length of the concave-convex in the first direction may be about 5 nm or more.

In the forming of the stack structure, the sacrificial layer may be formed to have a thickness in a range from about 5 nm to about 30 nm.

In the forming of the stack structure, the separating layer may be formed to have a thickness in a range from about 5 nm to about 30 nm.

In one example, the depositing of the insulating material inside the channel hole may include depositing the insulating material only at an inlet of the channel hole.

According to some example embodiments, a memory device includes an insulating structure having a shape that includes a first surface, a first protrusion portion protruding from the first surface in a first direction, and a second protrusion portion protruding from the first surface in the first direction, a recording material layer on the first protrusion portion along a protruding shape of the first protrusion portion and extending to the first surface on the insulating structure and on the second protrusion portion along a protruding shape of the second protruding portion, a gate insulating layer conformally covering the recording material layer over the first protrusion portion and the second protrusion portion, a first gate electrode contacting the gate insulation layer adjacent to the first protrusion portion, and a second gate electrode contacting the gate insulation layer adjacent to the second protrusion portion. The insulating structure and the recording material layer define a first void between the first gate electrode and the first protrusion portion, and define a second void between the second gate electrode and the second protrusion portion.

The memory device may include a channel layer conformally covering the recording material over the first protrusion portion and the second protrusion portion.

The memory device may include a gate insulating layer conformally covering the channel layer over the first protrusion portion.

The memory device may have at least one of the first void or the second under vacuum.

At least one of the first void or the second void may include clean dry air.

The first gate electrode may have a first gate length over the first protrusion portion, and the second gate electrode may have a second gate length over the second protrusion portion, the second gate length different from the first gate length

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
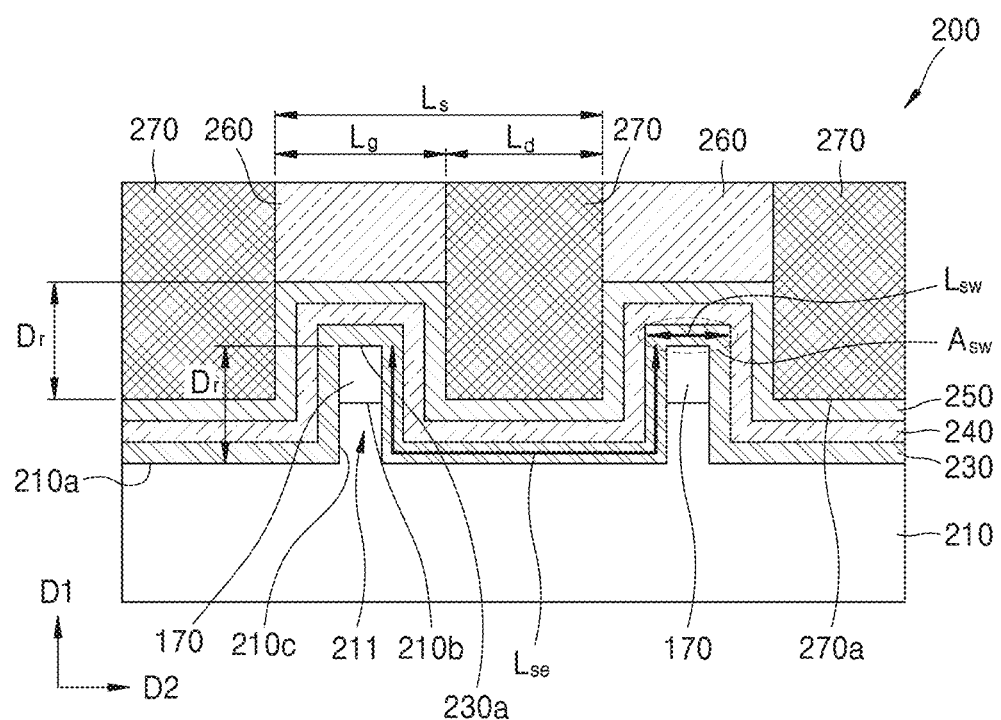
FIG. 1 is a schematic cross-sectional view showing a structure of a memory device according to some example embodiments.

Reference will now be made in detail to some example embodiments, examples of which are illustrated in the accompanying drawings, wherein like reference numerals refer to like elements throughout. In this regard, example embodiments may have different forms and should not be construed as being limited to the descriptions set forth herein. Accordingly, example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, some example embodiments will be described in detail with reference to the accompanying drawings. Example embodiments of inventive concepts are capable of various modifications and may be embodied in many different forms. In the drawings, like reference numerals refer to the like elements, and sizes of elements in the drawings may be exaggerated for clarity and convenience of explanation.

It will be understood that when an element or layer is referred to as being "on" or "above" another element or layer, the element or layer may be directly on another element or layer or intervening elements or layers.

It will be understood that, although the terms "first", "second", etc. may be used herein to describe various elements, these terms are only used to distinguish one element from another. These terms do not limit the difference between materials or structures of the components.

The singular forms are intended to include the plural forms as well, unless the context clearly indicates otherwise. Also, it should be understood that, when a part "comprises" or "includes" an element in the specification, unless otherwise defined, other elements are not excluded from the part and the part may further include other elements.

Also, in the specification, the term "units" and/or "modules" denote units or modules that process at least one function or operation, and may be realized by hardware, software, or a combination of hardware and software.

The term "above" and similar directional terms may be applied to both singular and plural.

With respect to operations that constitute a method, the operations may be performed in any appropriate sequence unless the sequence of operations is clearly described or unless the context clearly indicates otherwise. In addition, the use of any and all examples, or exemplary language (e.g., "such as") provided herein, is intended merely to better illuminate the inventive concept and does not pose a limitation on the scope of the inventive concept unless otherwise claimed.

Figure 2:
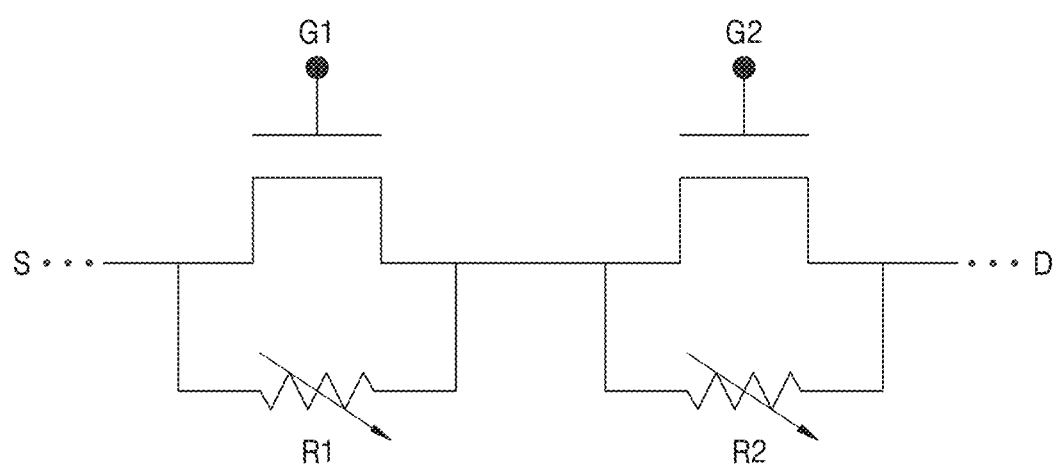
FIG. 2 shows an equivalent circuit of the memory device of FIG. 1.

FIG. 1 shows a memory device according to some example embodiments, and FIG. 2 shows an equivalent circuit for the memory device of FIG. 1.

Referring to FIG. 1, the memory device 200 includes an insulating structure 210, a recording material layer 230, a channel layer 240, a gate insulating layer 250 sequentially formed on the insulating structure 210, and a gate electrode 260 on the gate insulating layer 250. The memory device also includes a separating layer 270 provided between adjacent two gate electrodes 260. The insulating structure 210 has a shape having a protrusion portion 211 protruding to a variably determined or predetermined distance in a first direction (D1 direction) from a first surface 210a. The recording material layer 230 and the channel layer 240 may be formed to be curved to cover the protrusion portion 211, e.g. may be conformally formed to cover the protrusion 211. This may induce stable switching in a switching area Asw in the recording material layer 230, which will be described again with reference to FIGS. 3A to 3C.

The recording material layer 230 covers side surfaces 210c of the protrusion portion 211. The recording material layer 230 may cover the entire side surfaces 210c and may contact/directly contact the side surfaces 210c. A second surface 210b, which is an upper surface of the protrusion portion 211 connecting both side surfaces 210c of the protrusion portion 211, is separated from a surface 230a of the recording material layer 230 that faces the second surface 210b of the protrusion portion 211. The surface 230a of the recording material layer 230 may be parallel with the second surface 210b. A void 170 is present between the recording material layer 230 and the protrusion portion 211. The void 170 is present between the gate electrode 260 and the protrusion portion 211. The void 170 is surrounded by the protrusion portion 211 and the recording material layer 230. Accordingly, a boundary of the void 170 may be determined by the protrusion portion 211 and the recording material layer 230. The void 170 may be intentionally formed to, among other potential reasons, prevent or reduce the likelihood of or impact from a decrease in a resistance change characteristic of the recording material layer 230 during a fabrication process of the memory device 200, and the pressure in the void 170 may be less than atmospheric pressure, for example, may be close to vacuum. The void 170 may have some air, e.g. may have clean, dry air that is under vacuum. The channel layer 240 is formed along a surface shape of the recording material layer 230, and the gate insulating layer 250 is formed on the channel layer 240.

The gate electrode 260 is formed on the gate insulating layer 250 at a position facing the second surface 210b which is the upper surface of the protrusion portion 211. A length of the gate electrode 260 in a second direction (D2 direction) may be in a range from about 5 nm to about 30 nm.

The protrusion portion 211 may be provided in a multiple number in the second direction (D2 direction); for example there may be a plurality of protrusion portions 211. The plurality of protrusions 211 are separated from each other. The gate electrode 260 may also be provided in a multiple number to correspond to the plurality of protrusion portions 211; for example there may be a plurality of gate electrodes 260. The illustrated two gate electrodes 260 are examples. Because a single memory cell is formed in a unit of the gate electrode 260, the gate electrode 260 may be formed as many as the number of desired memory cells.

The separating layer 270 may be arranged between adjacent gate electrodes 260. A gap between the adjacent gate electrodes 260, e.g., a length $L_d$ of the separating layer 270 in the second direction (D2 direction), may be in a range from about 5 nm to about 30 nm.

The gate electrode 260 has a shape recessed from a surface 270a of the separating layer 270 by a distance $D_r$ in the first direction (D1 direction). The surface 270a is parallel with the first surface 210a. The gate insulating layer 250, the channel layer 240, and the recording material layer 230 are formed along or are conformal along the curved path of the recessed region.

A region of the recording material layer 230 facing the gate electrode 260 becomes or corresponds to a switching region $A_{sw}$, and both ends of the switching region $A_{sw}$ in the second direction (D2 direction) contact the channel layer 240, respectively. A length $L_{sw}$ of the switching region $A_{sw}$ in the second direction (D2 direction) is formed less than a length of the gate electrode 260 in the second direction (D2 direction). In addition, an electrical separation distance between the adjacent switching regions $A_{sw}$ is formed greater than a physical distance between the two switching regions $A_{sw}$. As shown in FIG. 1, the electrical distance between two adjacent switching regions $A_{sw}$ is determined along the path, e.g. a current path, of the recording material layer 230 and may be expressed as $L_{se}$. The physical distance between adjacent two switching regions $A_{sw}$ may be seen as an approximately, $L_{se}-2D_r$. For example, the electrical distance between the adjacent switching regions $A_{sw}$ is greater as much as 2D_r than the physical distance between the adjacent switching regions $A_{sw}$. Interference between adjacent cells may be alleviated as the electrical separation distance between adjacent switching regions $A_{sw}$ increases.

In the memory device 200 according to some example embodiments, the electrical separation distance between adjacent cells is not limited by the separation distance $L_d$ between the gate electrodes 260 and may be secured greater than the separation distance $L_d$. Therefore, the length $L_S$, which is a length of the basic cell, may be effectively reduced, which may improve integration efficiency of the memory device 200.

The distance $D_r$ may be set so that the switching region $A_{sw}$ as described above may be formed, for example, 5 nm or more, or 1 nm. An upper limit of $D_r$ is not specifically limited, and may be appropriately set in consideration of, for example, process conditions. The $D_r$ may be set in the range from about 1 nm to about 30 nm. In one example, $D_r$ may be in a range from about 5 nm to about 30 nm.

The flat first surface 210a of the insulating structure 210 and the second surface 210b which is the upper surface of the protrusion portion 211 may be parallel to each other. However, example embodiments are not limited thereto. The side surfaces 210c of the protrusion portion 211 are perpendicular to the first surface 210a, but this is an example, and as long as the switching region $A_{sw}$ described above may be formed, the shape of the protrusion portion 211 may be variously changed.

The recording material layer 230 may include a variable resistive material. The variable resistive material is a material in which oxygen vacancy is formed or present by the behavior of oxygen in the variable resistive material according to an applied voltage, and accordingly, a conductive filament is formed or present. Depending on the presence of the conductive filament, the variable resistive material may exhibit a low resistance state or a high resistance state, and thus information of '1' or '0' may be recorded. Because the void 170 exists between the recording material layer 230 and the protrusion portion 211 of the insulating structure 210, direct contact between the recording material layer 230 and the protrusion portion 211 is prevented, or reduced, in at least the switching region $A_{sw}$, and thus, the deterioration of the variable resistance characteristic, for example, the oxygen vacancy characteristic of the recording material layer 230 may be prevented or reduced in likelihood of occurrence. Accordingly, the operation of the memory device 200 may be stabilized, and reliability of the recorded data may be increased. As the variable resistive material, any one of $Rb_2O$, $TiO_2$, $BaO$, $ZrO_2$, $CaO$, $HfO_2$, $SrO$, $Sc_2O_3$, $MgO$, $Li_2O$, $Al_2O_3$, $SiO_2$, $BeO$, $Sc_2O_3$, $Nb_2O_5$, $NiO$, $Ta_2O_5$, $WO_3$, $V_2O_5$, $La_2O_3$, $Gd_2O_3$, $CuO$, $MoO_3$, $Cr_2O_3$, and $MnO_2$ may be used. Also, the recording material layer 230 may have a layer structure including a plurality of layers that are formed of two or more of the above materials.

The recording material layer 230 may include a phase change material. The phase change material is a material that exhibits a high resistance in an amorphous state and a low resistance in a crystalline state. The phase change may occur by a Joule heating through an electrical pulse. Depending on the phase, data such as a '1' or a '0' may be recorded. Due to the presence of the void 170, the deterioration of the phase change characteristic of the recording material layer 230 may be prevented or reduced in likelihood of occurrence. As the phase change material, for example, $Ge_2Sb_2Te_5$ (GST) may be used; alternatively or additionally, various chalcogenide materials, such as $Ga_2Sb_2Te_5$, InSbTe, or GeSeTe may be used.

In the following description, a variable resistance material is used as the recording material layer 230, but the recording material layer 230 is not limited thereto.

The recording material layer 230 may have a thickness in a range from about 0.5 nm to about 30 nm. In one example, the thickness of the recording material layer 230 may be in a range from about 0.5 nm to about 20 nm.

The channel layer 240 may include a semiconductor material and may include, for example, polysilicon. The channel layer 240 may be doped with a dopant such as a predetermined or variably determined dopant. For example, the channel layer 240 may be doped in a p-type like the substrate (520 of FIGS. 4 and 5). However, example embodiments are not limited thereto. The channel layer 240 may include, for example, a material, such as Ge, IGZO, GaAs, etc. A source electrode S and a drain electrode D as shown in FIG. 2 may be connected to both ends of the channel layer 240.

The gate insulating layer 250 may include various insulating materials, such as at least one of silicon oxide, silicon nitride, or silicon oxynitride.

A voltage for turning on/off the channel layer 240 may be selectively applied to the gate electrode 260.

The memory device 200 may have a structure in which a plurality of memory cells are arrayed, and, as shown in the equivalent circuit of FIG. 2, may have a form in which a transistor and a variable resistor are connected in parallel. Each variable resistor is set by a voltage applied to gate electrodes G1 and G2 and a voltage between the source electrode S and the drain electrode D, and becomes a value corresponding to information of 1 or 0. The transistors may be N-type transistors; however, example embodiments are not limited thereto, and at least one of the transistors may be P-type transistors.

Figure 3A:
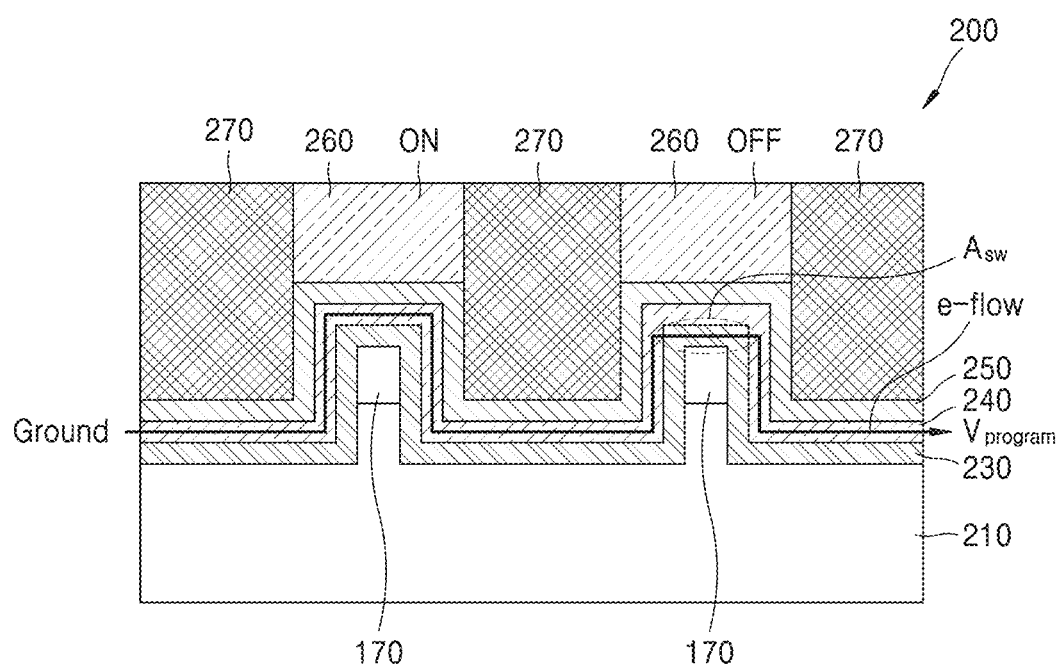
FIGS. 3A to 3C are schematic cross-sectional views for explaining write, read, and erase operations in the memory device of FIG. 1.
Figure 3B:
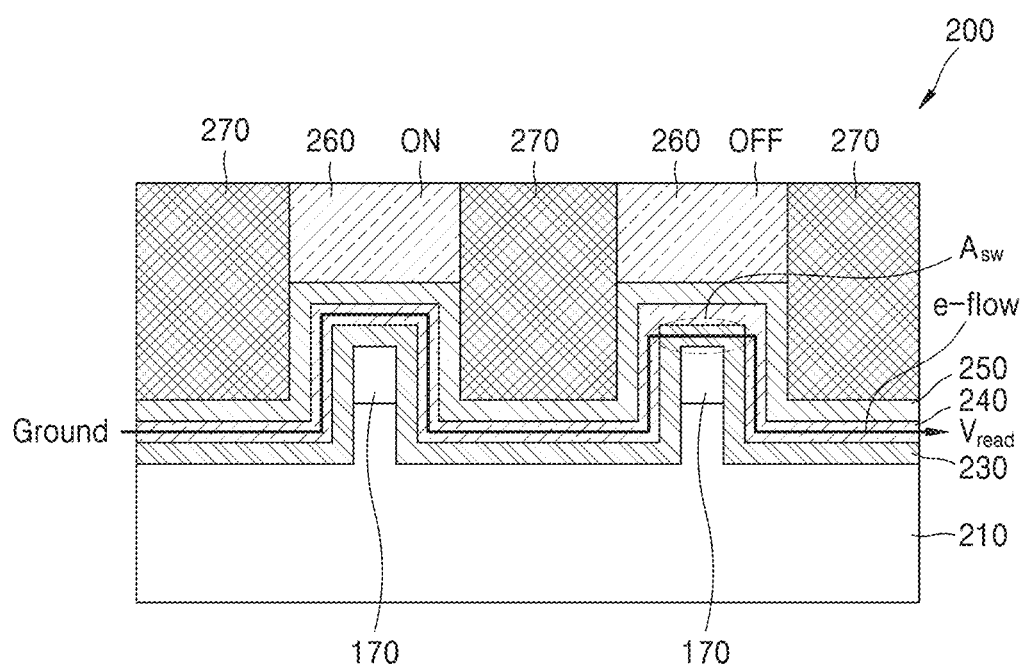
Figure 3C:
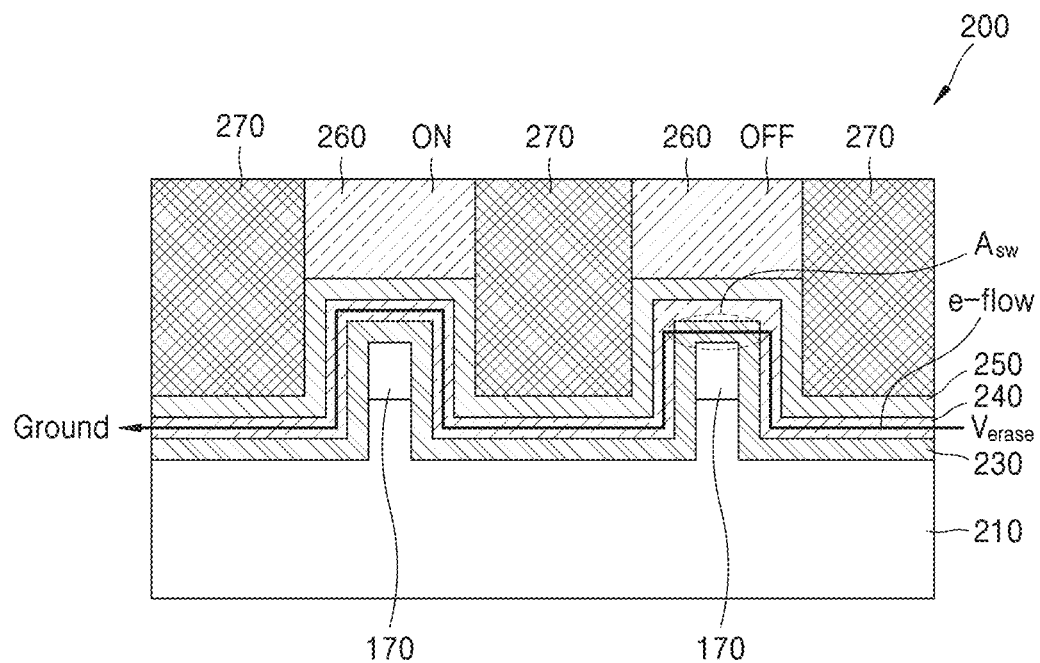

FIGS. 3A to 3C are schematic cross-sectional views for explaining write, read, and erase operations of the memory device of FIG. 1.

Referring to FIG. 3A, a memory cell on the left is not selected as a write cell, but a memory cell on the right is selected as a write cell. Accordingly, a gate voltage for channel-on ON is applied to the left gate electrode 260 and a gate voltage for channel-off OFF is applied to the right gate electrode 260. When a write voltage $V_{program}$ is applied to both ends of the channel layer 240, a current flows along the channel layer 240 in the memory cell (left) that is in a channel-on state, and a current flow through the recording material layer 230, not the channel layer 240 in the memory cell (right) that is in a channel-off state. For example, the resistance state of the corresponding switching region $A_{sw}$ is switched and information is recorded.

Referring to FIG. 3B, the left memory cell is an unselected cell and a voltage for channel-on ON is applied to the gate electrode 260, and the right memory cell is a selected cell and a voltage for channel-off OFF is applied to the gate electrode 260. For a read operation, a read voltage $V_{read}$ that does not change the resistance state of the switching region $A_{sw}$, e.g. is lower than the program voltage $V_{program}$, is applied to both ends of the channel layer 240. In the right memory cell that is channel-off OFF, a current does not flow to the channel layer 240 but flows through the recording material layer 230, and the resistance state of the corresponding memory cell may be read by measuring the current.

Referring to FIG. 3C, in order to erase information recorded in the right memory cell, an erase voltage $V_{erase}$ is applied to the memory cell so that a current flows in a direction opposite to the current flow when a write voltage $V_{program}$ is applied. The erase voltage $V_{erase}$ may be the same order of magnitude, but opposite polarity, from the program voltage $V_{program}$; however, example embodiments are not limited thereto. The left memory cell is an unselected cell and a voltage for channel-on ON is applied to the gate electrode 260, and the right memory cell is a selected cell and a voltage for channel-off OFF is applied to the gate electrode 260. In the right memory cell that is channel-off OFF, a current does not flow to the channel layer 240 and flows to the recording material layer 230 in a direction opposite to the current flow when a write voltage $V_{program}$ is applied, and the resistance state is switched.

In the switching region $A_{sw}$ of the memory cell selected in FIGS. 3A to 3C, the channel layers 240 are in contact with both ends of the switching region $A_{sw}$. Accordingly, the direction of current flowing through the channel layer 240, the recording material layer 230, and the channel layer 240 may be constant. As a result, a further smooth cell switching is possible.

Figure 4:
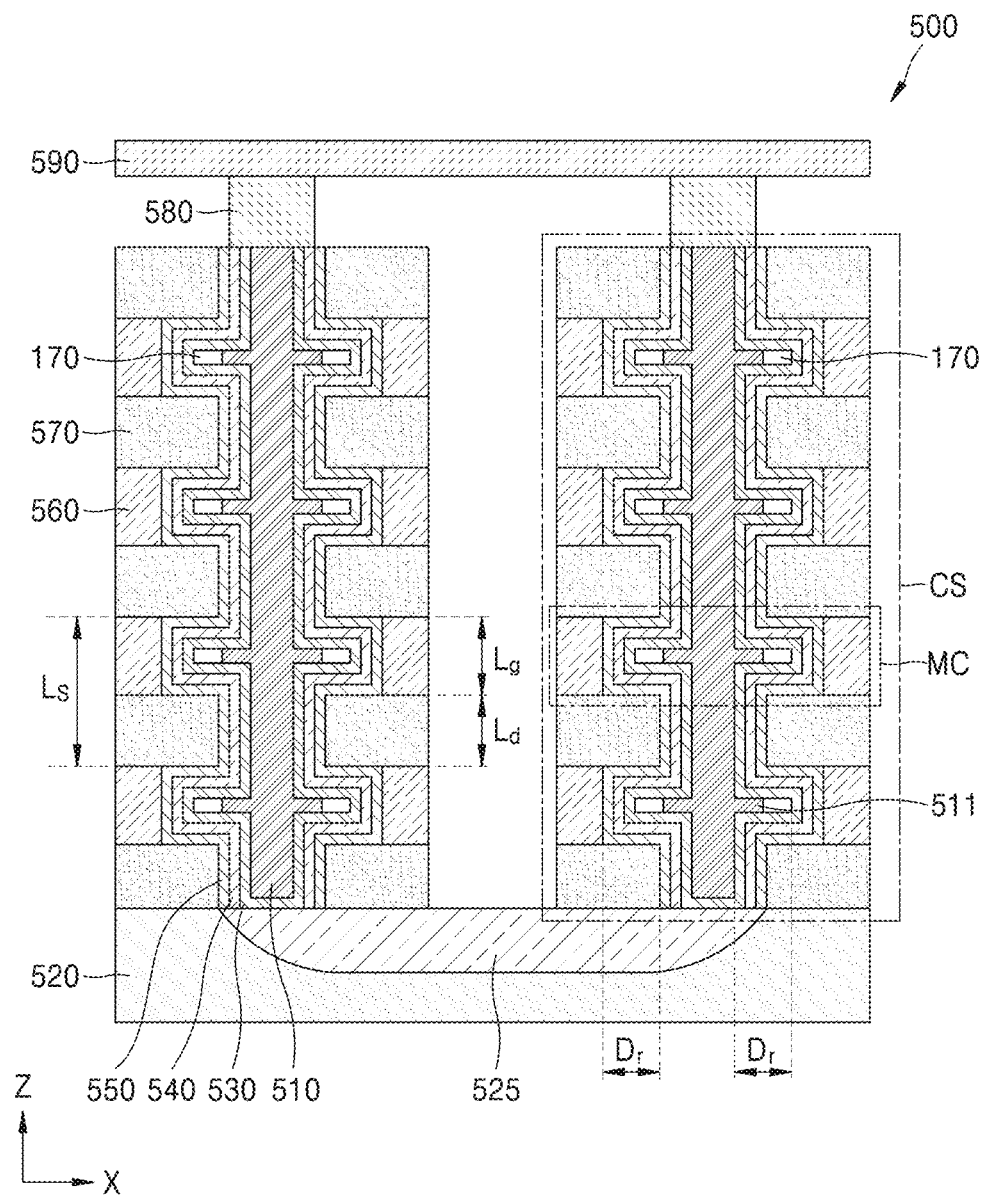
FIG. 4 is a schematic cross-sectional view showing a configuration of a memory device according to some example embodiments.
Figure 5:
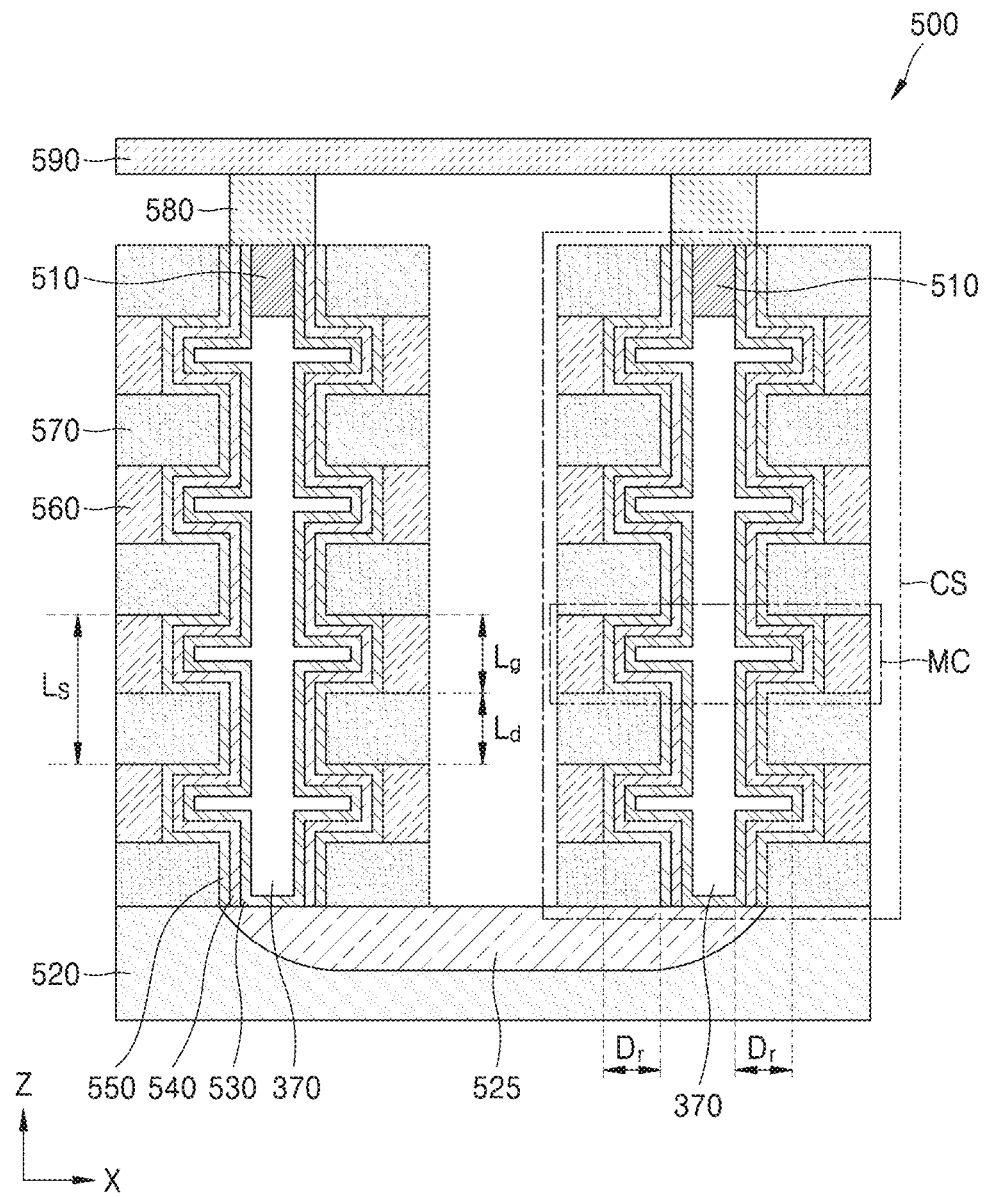
FIG. 5 is a schematic cross-sectional view showing a configuration of a memory device according to another embodiment.
Figure 6:
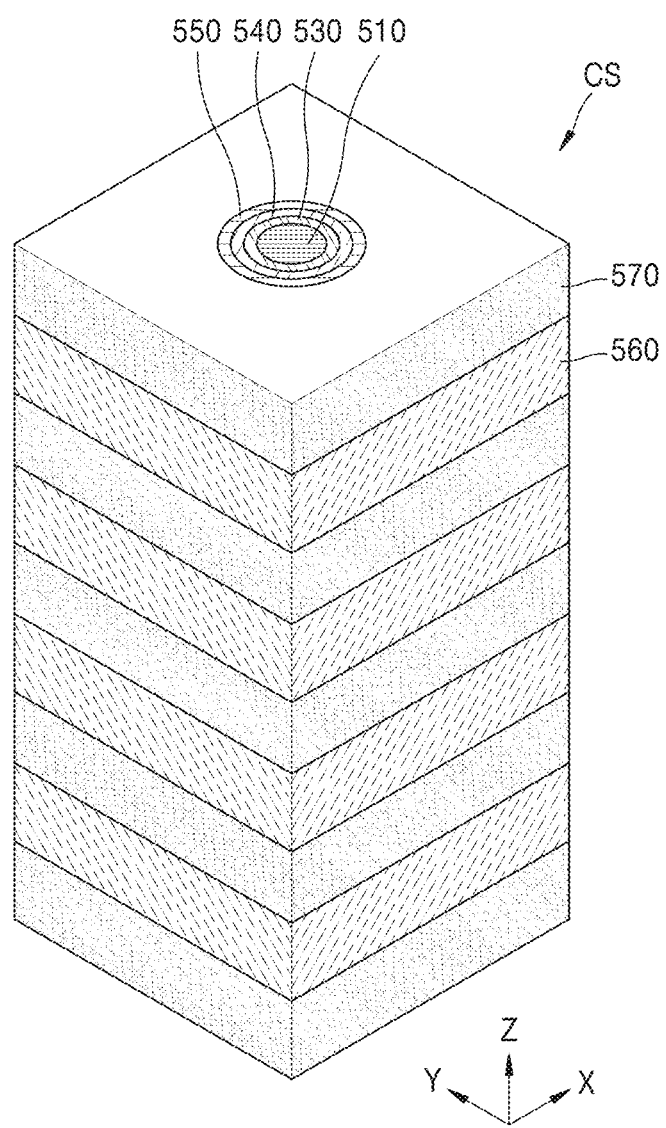
FIG. 6 is a perspective view showing a schematic structure of a memory string included in the memory device of FIGS. 4 and 5.
Figure 7:
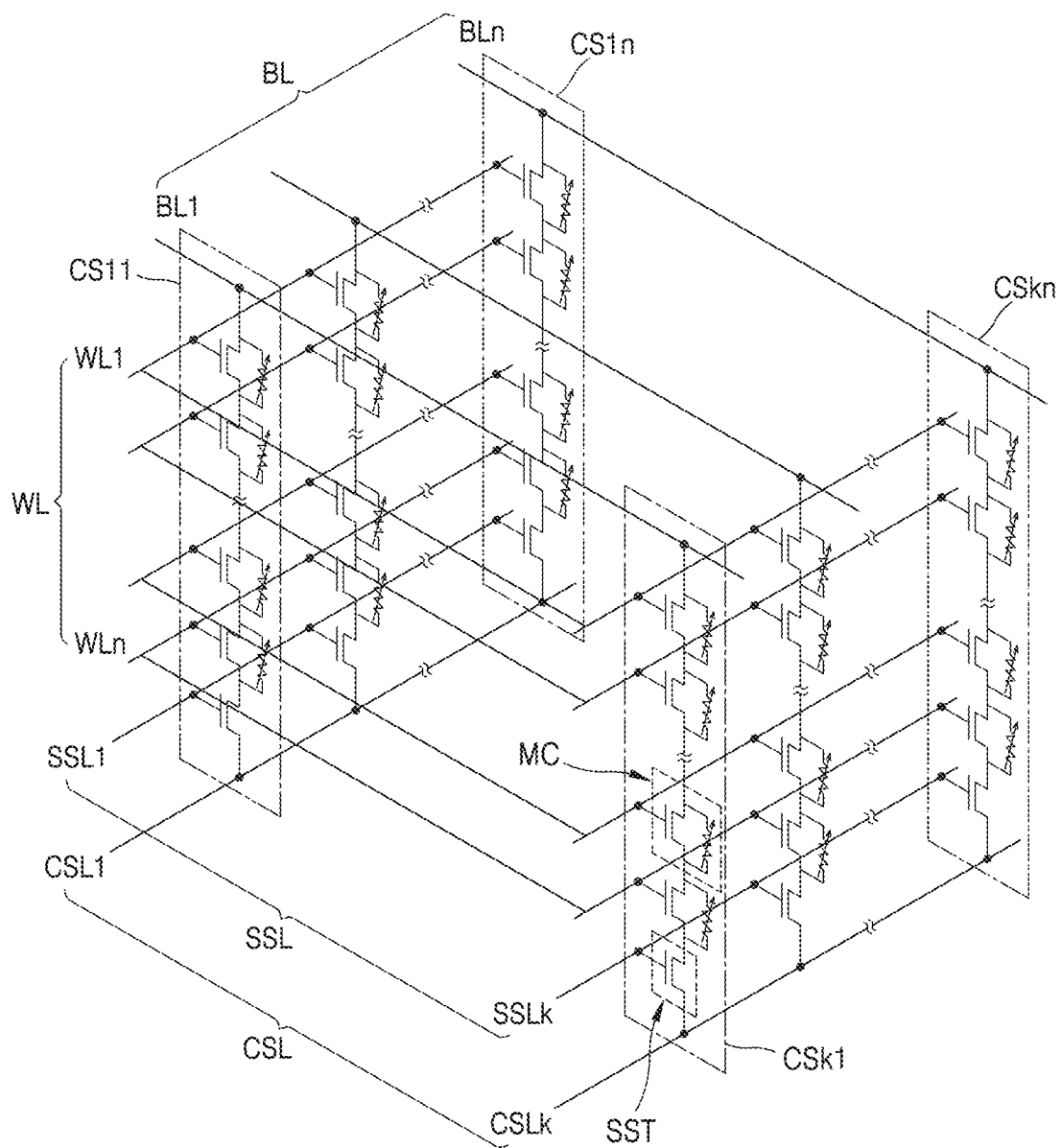
FIG. 7 is an equivalent circuit diagram of the memory device of FIGS. 4 and 5.

FIGS. 4 and 5 show a schematic structure of a memory device 500 according to some example embodiments, and FIG. 6 is a three dimensional view of a schematic structure of a memory string included in the memory device 500 of FIGS. 4 and 5. FIG. 7 is an equivalent circuit diagram for the memory device 500 of FIGS. 4 and 5.

The memory device 500 according to some example embodiments may be a vertical NAND (VNAND) memory in which a plurality of memory cells MC are vertically arrayed. The memory device 500 may be or may include a Pc-VNAND using a phase change material or a Re-VNAND using a variable resistance material.

Referring to FIGS. 4 to 7 together, a detailed configuration of the memory device 500 will be described as follows.

First, referring to FIG. 4, a plurality of cell strings CS are formed on a substrate 520.

The substrate 520 may be or may include a silicon material, e.g. a single-crystal silicon material, doped with a first type dopant. For example, the substrate 520 may include a silicon material doped with a p-type dopant such as boron. For example, the substrate 520 may be or may include a p-type well (for example, a pocket p-well). Hereinafter, it is assumed that the substrate 520 is a p-type silicon. However, the substrate 520 is not limited to the p-type silicon.

A doped region 525 which is a source region is provided on the substrate 520. The doped region 525 may have an n-type different from that of the substrate 520. For example, the doped region 525 may be doped with impurities such as at least one of arsenic or phosphorus. Hereinafter, it is assumed that the doped region 525 is an n-type. However, the doped region 525 is not limited to n-type. The doped region 525 may be connected to a common source line CSL.

As shown in the equivalent circuit diagram of FIG. 7, k*n cell strings CS may be provided and may be arranged in a matrix form, and may be named as or referred to as CSij ($1 \leq i \leq k$, $1 \leq j \leq n$) according to a position of each row and column. Each cell string CSij is connected to a bit line BL, a string selection line SSL, a word line WL, and a common source line CSL.

Each cell string CSij includes memory cells MC and a string selection transistor (SST). The memory cells MC and the string selection transistor (SST) of each cell string CSij may be stacked in a height direction.

Rows of a plurality of cell strings CS are connected to different string selection lines SSL1 to SSLk. For example, the string selection transistors SSTs of the cell strings CS11 to CS1n are commonly connected to the string selection line SSL1. The string selection transistors SST of the cell strings CSk1 to CSkn are commonly connected to the string selection line SSLk.

Columns of the plurality of cell strings CS are connected to different bit lines BL1 to BLn, respectively. For example, the memory cells of the cell strings CS11 to CSk1 and the string selection transistors SST may be commonly connected to the bit line BL1, the memory cells MC of the cell strings CS1n to CSkn and the string selection transistors SST may be commonly connected to the bit line BLn.

The rows of the plurality of cell strings CS may be connected to different common source lines CSL1 to CSLk, respectively. For example, the string selection transistors SST of the cell strings CS11 to CS1n may be commonly connected to the common source line CSL1, and the string selection transistors SST of the cell strings CSk1 to CSkn may be commonly connected to the common source line CSLk.

Gate electrodes of the memory cells MC located at the same height from the substrate 520 (e.g. from the same vertical height from the substrate) and/or the string selection transistors SST are commonly connected to one word line WL, and gate electrodes of the memory cells MC located at different heights may be connected to different word lines WL1 to WLm, respectively.

The illustrated circuit structure is an example. For example, the number of rows of cell strings CS may be increased or reduced. As the number of rows of cell strings CS is changed, the number of string selection lines SSL connected to rows of cell strings CS and the number of cell strings CS connected to one bit line may also be changed. As the number of rows of cell strings CS is changed, the number of common source lines CSL connected to the rows of cell strings CS may also be changed. Example embodiments are not limited thereto.

Alternatively or additionally, the number of columns of the cell strings CS may be increased or reduced. As the number of columns of the cell string CS is changed, the number of bit lines connected to the columns of the cell strings CS and the number of cell strings CS connected to one string selection line SSL may also be changed. Example embodiments are not limited thereto.

Alternatively or additionally, the height of the cell string CS may also be increased or reduced. For example, the number of memory cells MC stacked in each of the cell strings CS may be increased or reduced. As the number of memory cells MC stacked in each of the cell strings CS is changed, the number of word lines WL may also be changed. For example, the string selection transistor SST provided to each of the cell strings CS may be increased. As the number of string selection transistors SST provided to each of the cell strings CS is changed, the number of string selection lines SSL or common source lines CSL may also be changed. When the number of string selection transistors SST increases, the string selection transistors SST may be stacked in the same shape as the memory cells MC. Example embodiments are not limited thereto.

For example, writing and reading may be performed in units of rows of cell strings CS. Cell strings CS may be selected in units of one row by the common source line CSL, and cell strings CS may be selected in a row unit by the string selection lines SSL. Also, a voltage may be applied to the common source lines CSL using at least two common source lines as a unit. A voltage may be applied to the common source lines CSL using the entire common source lines CSL as a unit.

In the selected row of the cell strings CS, write and read may be performed in units of pages. The page may be one row of memory cells connected to one word line WL. In the selected row of cell strings CS, memory cells may be selected in units of pages by word lines WL.

As shown in FIGS. 4, 5, and 6, the cell string CS may have a shape in which a plurality of gate electrodes 560 and a plurality of separating layers 570 alternately surround a structure including an insulating structure 510, a recording material layer 530, a channel layer 540, and a gate insulating layer 550. The cell string CS is illustrated in the form of a square column, but this is an example and is not limited thereto. The cell string CS may be formed in, for example, a cylindrical shape or a tapered shape or a prismatic shape.

The shape of the structure including the insulating structure 510, the recording material layer 530, the channel layer 540, and the gate insulating layer 550 will be described.

According to FIG. 4, the insulating structure 510 may have a shape in which a plurality of protrusion portions 511 surround a cylindrical surface with a predetermined width and protrude in a radial direction (the X-direction in FIG. 4) on a surface of a cylinder with a length direction in a Z-direction. A void 170 exists between the protrusion portion 511 and the gate electrode 560 in the radial direction; e.g. the void 170 is defined by the protrusion portion 511 and the gate electrode 560. The void 170 exists between the protrusion portion 511 and the recording material layer 530 in a location between the protrusion portion 511 and the gate electrode 560.

As shown in FIG. 5, the insulating structure 510 may be present only in a portion of an upper end of the cell string CS that contacts a drain region 580. In this case, an entire inner region 370 surrounded by the recording material layer 530 may become a void.

In FIGS. 4 and 5, $D_r$ may be about 5 nm or more. The $D_r$ may be in a range from about 1 nm to about 30 nm. In one example, the $D_r$ may be in a range from about 5 nm to about 30 nm.

The recording material layer 530 includes a variable resistance material or a phase change material. As the variable resistance material, any one of $Rb_2O$, $TiO_2$, $BaO$, $ZrO_2$, $CaO$, $HfO_2$, $SrO$, $Sc_2O_3$, $MgO$, $Li_2O$, $Al_2O_3$, $SiO_2$, $BeO$, $Sc_2O_3$, $Nb_2O_5$, $NiO$, $Ta_2O_5$, $WO_3$, $V_2O_5$, $La_2O_3$, $Gd_2O_3$, $CuO$, $MoO_3$, $Cr_2O_3$, or $MnO_2$ may be used. $Ge_2Sb_2Te_5$ (GST) may be used as the phase change material.

The channel layer 540 surrounds a surface of the recording material layer 530 with a thickness such as a variable determined or predetermined thickness. The channel layer 540 may include a semiconductor material doped with a first type. The channel layer 540 may include a silicon material doped with the same conductivity type as the substrate 520, for example, when the substrate 520 includes a silicon material doped with p-type dopants, the channel layer 540 may also include a silicon material doped with p-type dopants. Alternatively or additionally, the channel layer 540 may include a material, such as Ge, IGZO, or GaAs.

The gate insulating layer 550 surrounds a surface of the channel layer 540 with a variably determined or predetermined thickness. The gate insulating layer 550 may include various insulating materials, such as at least one of silicon oxide, silicon nitride, or silicon oxynitride.

In FIG. 4, the shape of a structure including the insulating structure 510, the recording material layer 530, the channel layer 540, and the gate insulating layer 550 is a shape in which a plurality of structures protruding in a radial direction are formed on a cylindrical surface. The shape of the structure of FIG. 4 may be similar to the shape of the insulating structure 510 disposed innermost.

The gate electrode 560 surrounds the protruding portion of an outer surface of an internal structure, and the separating layer 570 surrounds a recessed portion of the outer surface of the internal structure. The separating layers 570 are for separating the plurality of gate electrodes 560, and the plurality of gate electrodes 560 and the plurality of separating layers 570 may be alternately stacked in a vertical direction (Z-direction).

A length of the gate electrode 560 in the Z-direction is $L_g$, and a separation distance between the gate electrodes 560, that is, a length of the separating layer 570 in the Z-direction is $L_d$. In this structure, as described with reference to a similar structure of FIG. 1, apart from $L_g$ and $L_d$, a separation distance between adjacent cells and a length of a switching region formed in the recording material layer 530 may be set.

The gate electrode 560 may include a metal material and/or a silicon material doped with a high concentration. Each of the gate electrodes 560 is connected to one of the word line WL and the string selection line SSL. The separating layer 570 may include various insulating materials, such as at least one of silicon oxide, silicon nitride, etc. When viewed from a surface where the gate electrode 560 and the separating layer 570 contact the gate insulating layer 550, the gate electrode 560 is recessed as much as $D_r$ from the separating layer 570.

A manufacturing process/fabrication process of the cell string CS described above may be performed in an order from an external structure to an internal structure. For example, first, a structure in which the gate electrode 560 and the separating layer 570 of a cylinder shell shape having the same outer diameter and different inner diameters by $D_r$ is formed, and then, the gate insulating layer 550, the channel layer 540, and the recording material layer 530 may be sequentially conformally deposited on an inner surface of the structure. This will be described later in the description of the manufacturing method.

One end of the channel layer 540 and the recording material layer 530 may contact a doped region 525, for example, a common source region 525. A drain region 580 may be provided at the other end of the channel layer 540 and the recording material layer 530. The drain region 580 may include a silicon material doped in a second type. For example, the drain region 580 may include a silicon material doped with an n-type dopant such as at least one of phosphorus or arsenic. A bit line 590 may be provided on the drain region 580. The drain region 580 and the bit line 590 may be connected through contact plugs.

Each of the gate electrodes 560 and regions of the gate insulating layer 550, the channel layer 540, and the recording material layer 530 at a position facing the gate electrode 560 constitute a memory cell MC. For example, the memory cell MC may have a circuit structure in which a transistor including the gate electrode 560, the gate insulating layer 550, and the channel layer 540 and a variable resistance by the recording material layer 530 are connected in parallel. The parallel connection structure is continuously arranged in the vertical direction (Z-direction) to construct a cell string CS. In addition, as shown in the circuit diagram of FIG. 7, both ends of the cell string CS may be connected to the common source line CSL and the bit line BL. When a voltage is applied to the common source line CSL and the bit line BL, at least one of, or exactly one of, a program (write), read, or erase process may be performed on the plurality of memory cells MC.

For example, when a memory cell MC to be written is selected, a gate voltage value of the corresponding memory cell is adjusted so that a channel is not formed in the selected cell, that is, the channel is in an OFF state, and for the unselected memory cells MC, a gate voltage value of the memory cells is adjusted so that the channel is in an ON state. Accordingly, a current path by a voltage applied to the common source line CSL and the bit line BL passes through a region of the recording material layer 530 of the selected memory cell MC. When the applied voltage is $V_{set}$ or $V_{reset}$, the selected memory cell MC may be in a low resistance state or a high resistance state. In this way, desired information of 1 or 0 may be written to the selected memory cell MC.

In a read operation, similarly to the write operation (or program operation), a read of a selected memory cell MC may be performed. For example, after a gate voltage applied to each of the gate electrodes 560 is adjusted so that the selected memory cell MC is channel-off state and the unselected memory cells MCs are channel-on state, a cell state (1 or 0) may be checked by measuring a current flowing through the corresponding memory cell MC by an applied voltage $V_{read}$ between the common source line CSL and the bit line BL.

In the VNAND structure, due to a packaging limit according to the height of the cell string CS, there may be a limit in increasing the number of gate electrodes 560 included in the cell string CS. For example, there may be a limit in reducing the distance $L_d$ between adjacent gate electrodes 560 due to interference between adjacent memory cells. Accordingly, a memory capacity is limited by a limit value capable of reducing the sum $L_s$ of vertical direction lengths of the gate electrodes 560 and the separating layers 570 adjacent in the vertical direction (a Z-direction).

As described above, in the memory device 500 according to some example embodiments, a memory cell MC including a channel layer 540 and a recording material layer 530 is configured by using a recessed gate structure or a protruding insulating structure form so that a current path capable of exhibiting a stable switching behavior is formed, and a memory device is implemented by arraying the memory cells MCs. Accordingly, compared to a structure in which a channel layer and a recording material layer are formed in a certain direction, the electrical separation distance between memory cells may be secured or held stable while the (physical) distance $L_d$ between the gate electrodes 560 is reduced, and also, the length of a switching region may be less than the length $L_g$ of the gate electrode 560. Additionally or alternatively, a void 170 exists between the gate electrode 560 and the insulating structure 510 and between the recording material layer 530 and the insulating structure 510, thus, direct contact between the recording material layer 530 and the insulating structure 510 may be prevented or reduced in likelihood of occurrence. Due to this structure, the sum of lengths $L_s$ in the vertical direction (Z-direction) of the gate electrode 560 and the separating layer 570 may be reduced or minimized, thereby increasing the degree of integration and/or preventing or reducing the likelihood of deterioration of resistance change characteristic of the recording material layer 530, and/or having a low operating voltage.

As described above, the memory device 500 according to some example embodiments may solve a scaling issue between memory cells in a next-generation VNAND, thereby increasing integration density and/or being implementable with low power and/or increasing the reliability of recorded data.

FIGS. 8A to 17B are diagrams illustrating a method of manufacturing a memory device according to some example embodiments.

Figure 8A:
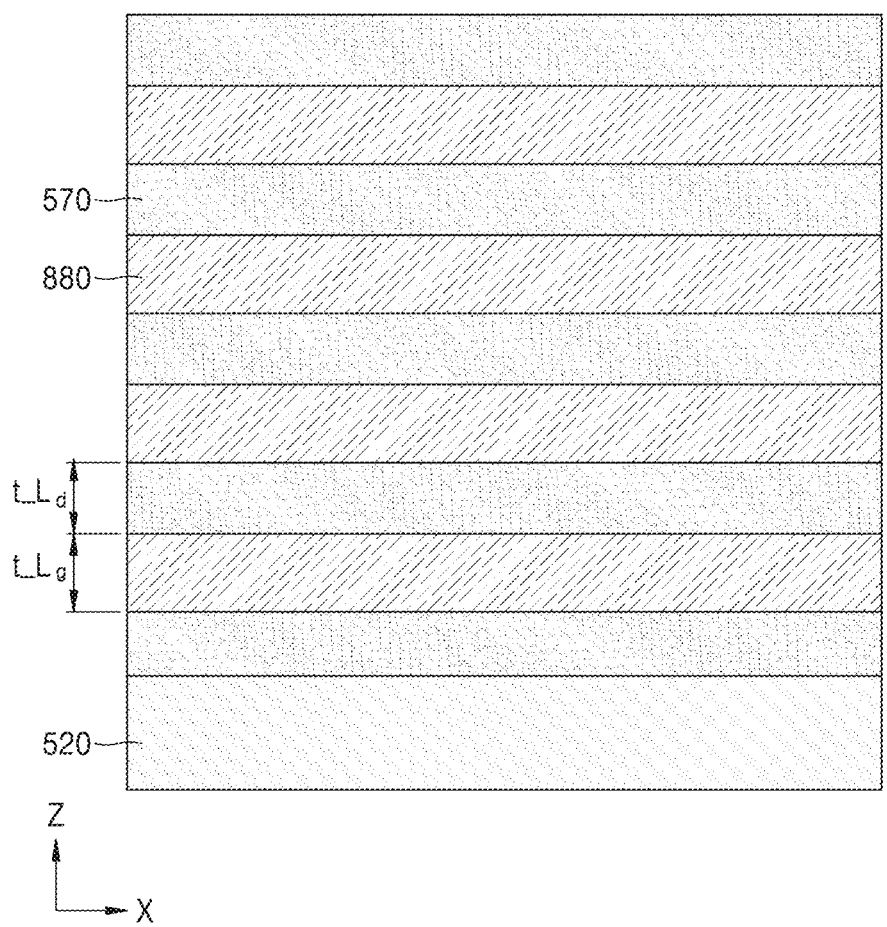
FIGS. 8A to 17B are diagrams illustrating a method of manufacturing a memory device according to some example embodiments.
Figure 8B:
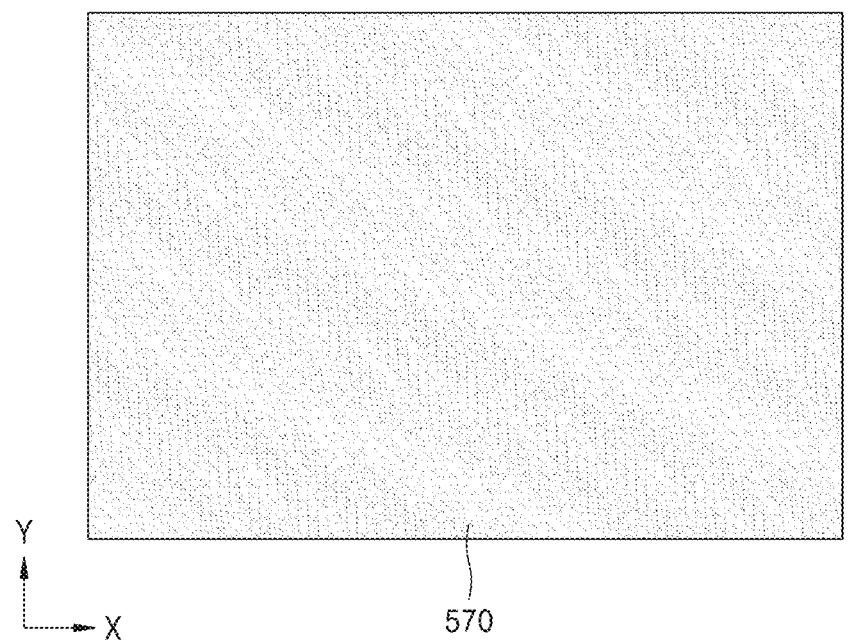

FIGS. 8A and 8B are a cross-sectional view and a plan view, respectively. First, a stack structure in which a separating layer 570 and a sacrificial layer 880 are alternately stacked on a substrate 520 is formed. The substrate 520 may be a silicon substrate and may be, for example, a silicon substrate doped with a dopant such as a variably determined or predetermined dopant. The substrate 520 may be a p-type silicon substrate, but is not limited thereto. The substrate 520 may be a wafer; however, example embodiments are not limited thereto.

The separating layer 570 includes an insulating material and may include, for example, $SiO_2$. The sacrificial layer 880 is a layer for forming a recess structure to form a channel layer and a recording material layer of a curved path, and may include a material having an etch-ratio different from that of the separating layer 570. The separating layer 570 may include, for example, $SiN_x$ such as silicon nitride (Si3N4) The thickness $t\_L_d$ of the separating layer 570 and the thickness $t\_L_g$ of the sacrificial layer 880 are respectively determined according to a detailed structure of a memory device to be manufactured, and may be the same or may be different from one another; furthermore a thickness of one separation layer 570 may be the same as or different from a thickness of other separation layers 570. The thickness $t\_L_d$ of the separating layer 570 and the thickness $t\_L_g$ of the sacrificial layer 880 correspond to a distance between gate electrodes of the memory device to be manufactured and the length $L_g$ of the gate electrode, respectively. The sacrificial layer 880 may have a thickness $t\_L_g$ in a range from about 5 nm to about 30 nm. The separating layer 570 may have a thickness $t\_L_d$ in a range from about 5 nm to about 30 nm. The gate electrode is formed at the location of the sacrificial layer 880; for example, the number of sacrificial layers 580 corresponds to the number of unit memory cells of the memory device to be manufactured.

For the formation of the separating layer 570 and the sacrificial layer 880, deposition methods, such as at least one of atomic layer deposition (ALD), metal organic atomic layer deposition (MOALD), chemical vapor deposition (CVD), metal organic chemical vapor deposition (MOCVD), physical vapor deposition (PVD), etc. may be used. The above methods include processes of placing the substrate 520 in a chamber, heating the chamber to a variably determined or predetermined temperature, and supplying a source gas into the chamber, and process conditions, such as temperature and/or time are adjusted according to the desired thickness.

Figure 9A:
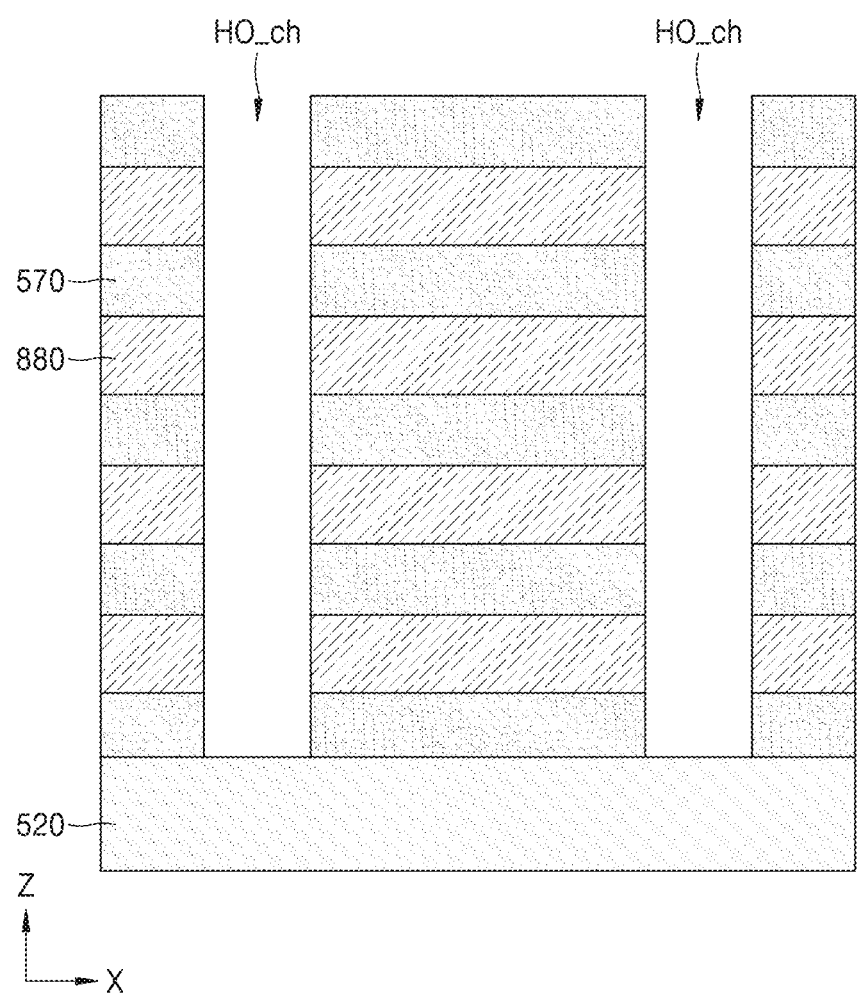
Figure 9B:
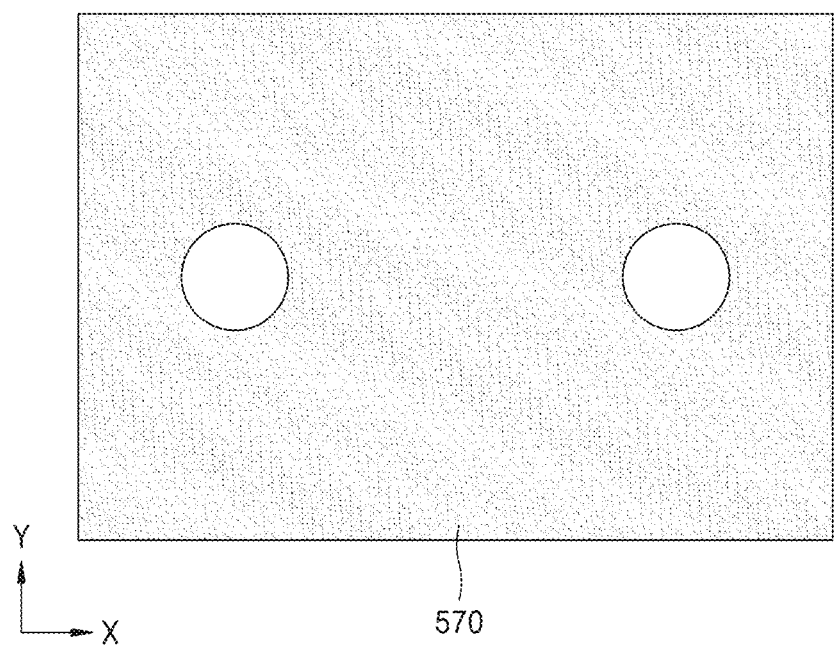

FIGS. 9A and 9B are a cross-sectional view and a plan view, respectively, and channel holes HO_ch are formed in the stack structure formed in the operation of FIGS. 8A and 8B. The channel hole HO_ch is or corresponds to a hole for forming a gate recess structure in the sacrificial layer 880 and for coating a channel material and a recording material. A photolithography and etching process may be used to form the channel hole HO_ch. Two channel holes HO_ch are shown in FIGS. 9A and 9B, but it is an example. For example, the channel holes HO_ch may be formed as many as the number of cell strings CS described in FIGS. 4 to 7.

The channel holes HO_ch may have a circular shape in plan view; however, example embodiments are not limited thereto. For example, the channel holes HO_ch may have an elliptical shape in plan view, or a polygonal shape in plan view.

Figure 10A:
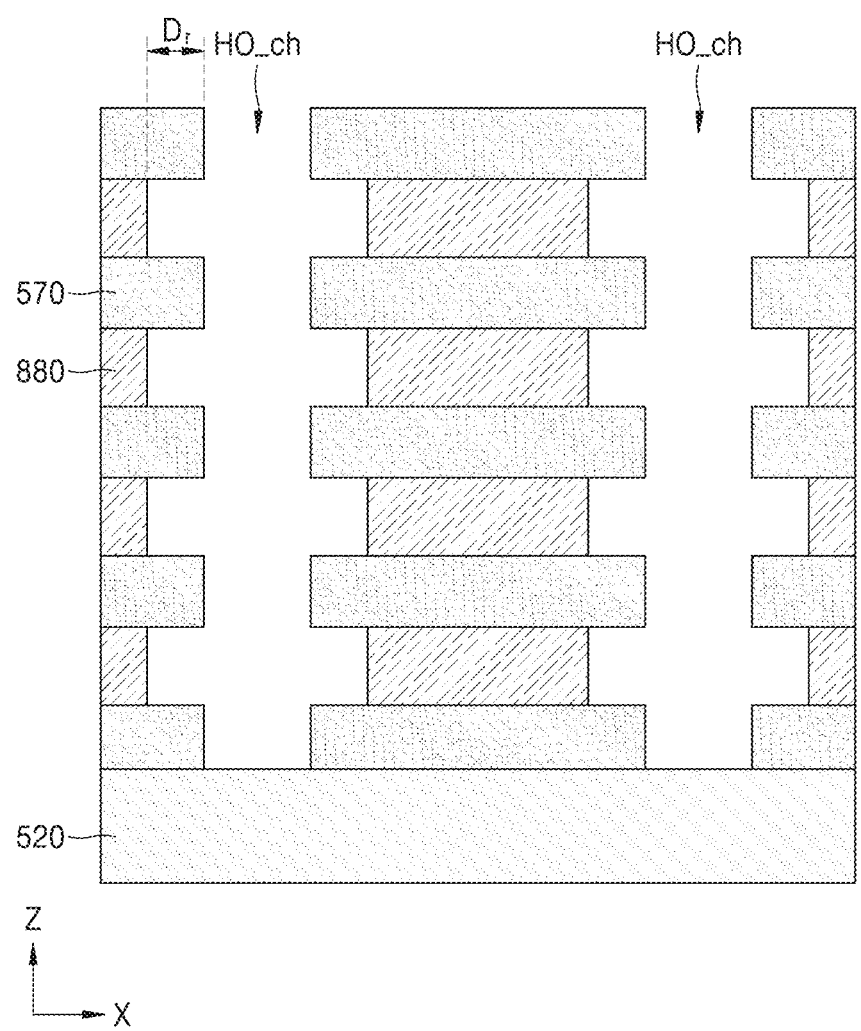
Figure 10B:
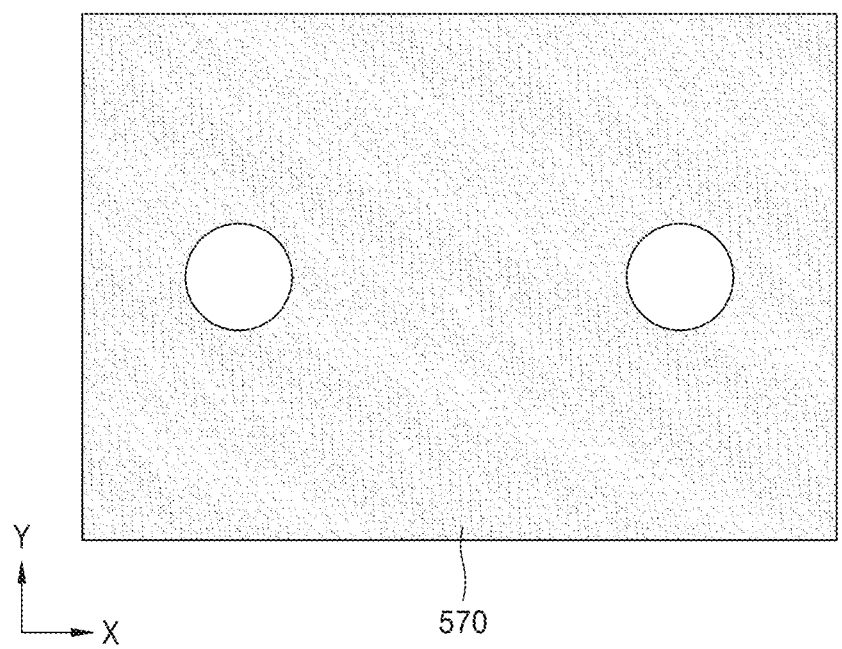

Next, referring to FIGS. 10A and 10B, the sacrificial layer 880 is partially etched to process an inner surface of the channel hole HO_ch into a saw-tooth shape or a bristlecone shape or a concave-convex shape, e.g. a shape having both concave protrusions and convex recesses. As a process for selectively etching the sacrificial layer 880 among the sacrificial layer 880 and separating layer 570 having different etching rates, a wet etching process using an etchant that etches the sacrificial layer 880 but does not etches or more slowly etches the separating layer 570 may be used. Alternatively, an etchant for etching the sacrificial layer 880 and the separating layer 570 at different rates may be used. However, example embodiments are not limited thereto. An etchant and etching time may be set so that a length of the concave-convex, for example, a length of the sacrificial layer 880 recessed from the separating layer 570 in the first direction (an X-direction) perpendicular to a stacking direction (a Z-direction) is a variably determined or predetermined desired $D_r$. $D_r$ may be, for example, greater than about 5 nm. $D_r$ may be in a range from about 1 nm to about 30 nm. In one example, $D_r$ may be in a range from about 5 nm to about 30 nm.

Figure 11A:
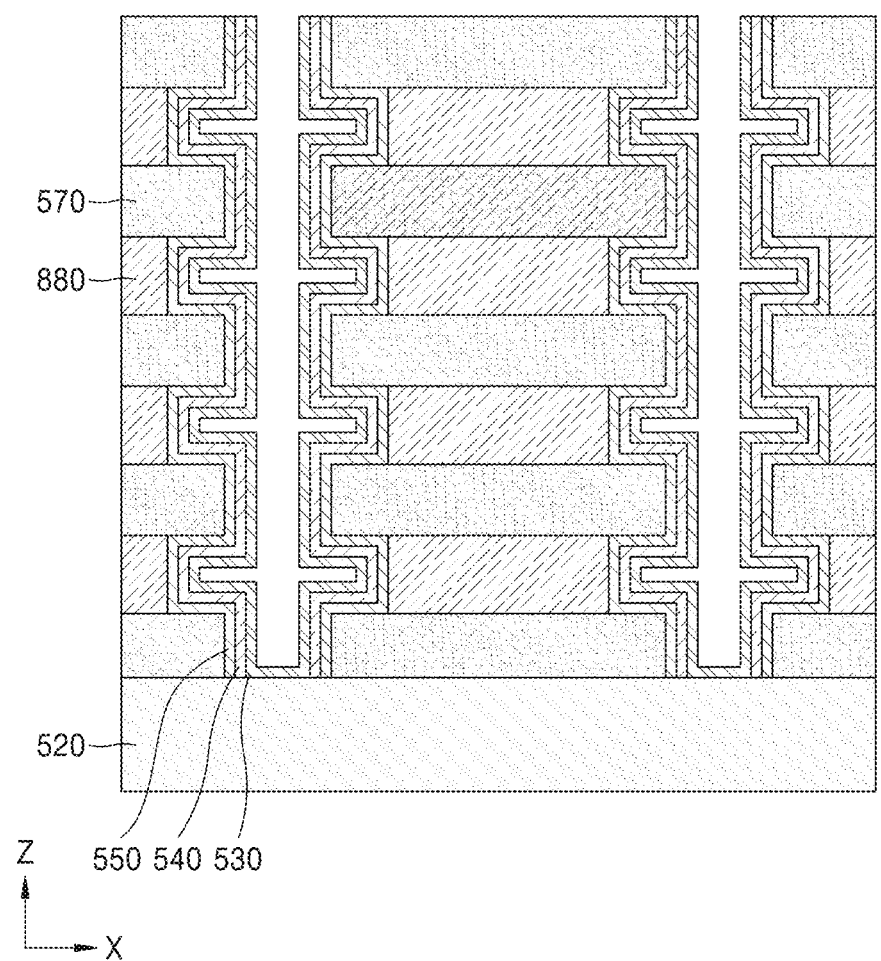
Figure 11B:
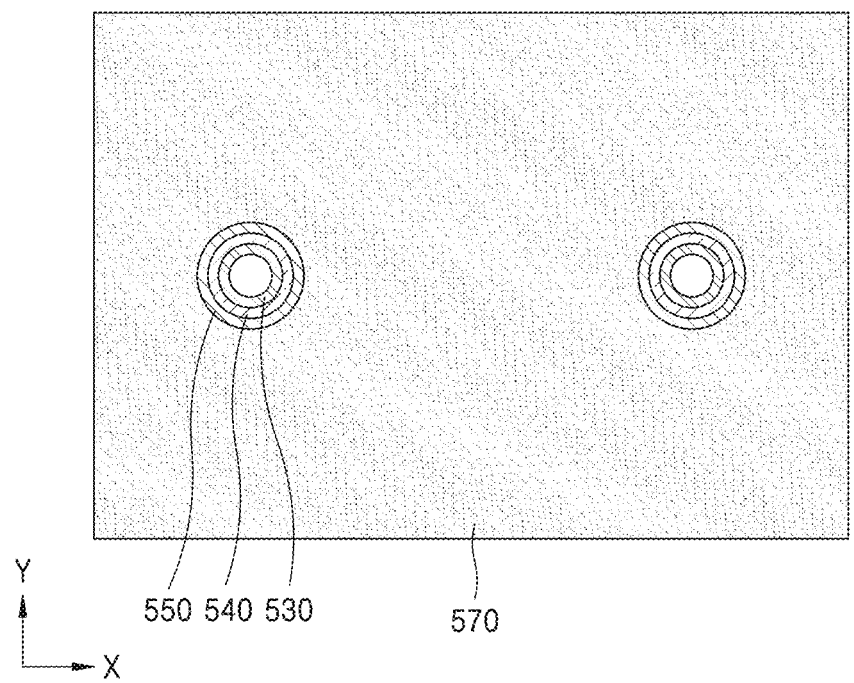

Next, referring to FIGS. 11A and 11B, a gate insulating layer 550, a channel layer 540, and a recording material layer 530 are sequentially formed on the inner surface of the channel hole HO_ch.

The gate insulating layer 550 may include various insulating materials, such as at least one of silicon oxide, silicon nitride, or silicon oxynitride. The channel layer 540 may include a semiconductor material and may include, for example, poly-Si. The channel layer 540 may be doped with a variably determined or predetermined dopant, and may be doped with a p-type dopant as the same type as the substrate 520. However, example embodiments are not limited thereto. The channel layer 540 may include a material, for example, at least one of Ge, IGZO, GaAs, and the like. The recording material layer 530 may include a variable resistance material or a phase change material. As the variable resistance material, at least one of $Rb_2O$, $TiO_2$, $BaO$, $ZrO_2$, $CaO$, $HfO_2$, $SrO$, $Sc_2O_3$, $MgO$, $Li_2O$, $Al_2O_3$, $SiO_2$, $BeO$, $Sc_2O_3$, $Nb_2O_5$, $NiO$, $Ta_2O_5$, $WO_3$, $V_2O_5$, $La_2O_3$, $Gd_2O_3$, $CuO$, $MoO_3$, $Cr_2O_3$, and $MnO_2$ may be used. $Ge_2Sb_2Te_5$ (GST) may be used as the phase change material.

For the formation of the films such as the gate insulating layer 550, the channel layer 540, and the recording material layer 530 and so on, deposition methods, such as at least one of atomic layer deposition (ALD), metal organic atomic layer deposition (MOALD), chemical vapor deposition (CVD), metal organic chemical vapor deposition (MOCVD), physical vapor deposition (PVD), etc. may be used. The methods include processes of placing a stack structure in which a channel hole HO_ch is formed in a chamber, heating the chamber to a variably determined or predetermined temperature, and supplying a source into the chamber, and, for each layer, process conditions, such as temperature and time are adjusted according to the desired thickness.

After the gate insulating layer 550 and the channel layer 540 are formed on an inner side of the channel hole HO_ch, and before the recording material layer 530 is formed, a process of removing an insulating material and a channel material deposited on a bottom surface of the channel hole HO_ch may be performed.

Figure 12A:
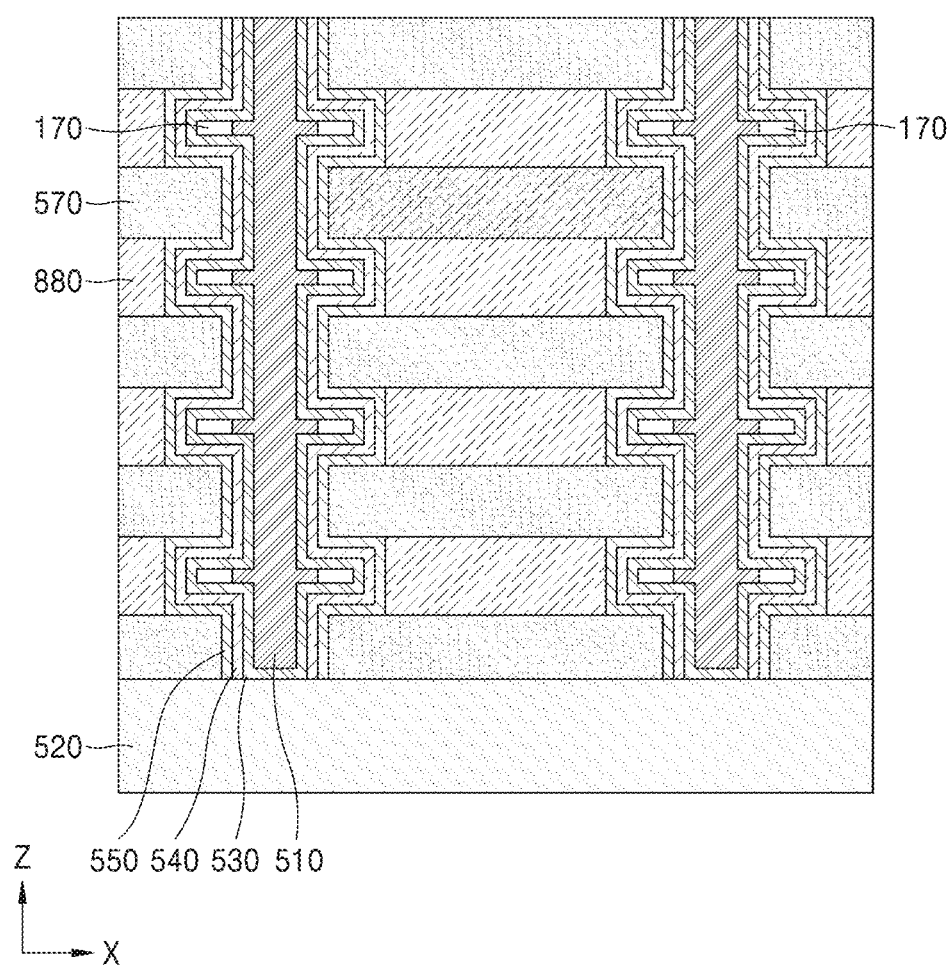
Figure 12B:
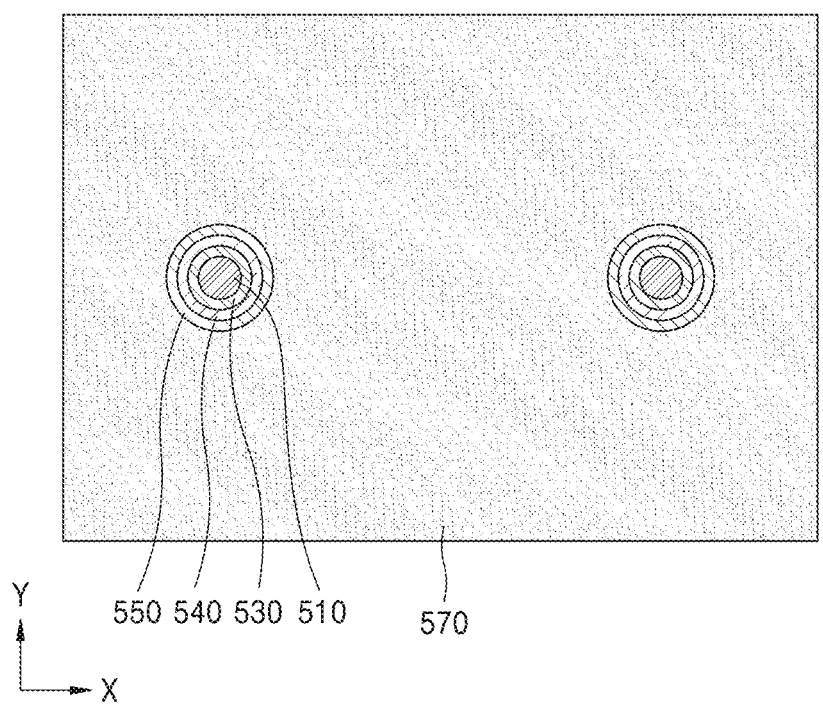

Next, as shown in FIGS. 12A and 12B, an insulating structure 510 is formed in a remaining space inside the channel hole HO_ch. In the forming of the insulating structure 510, the insulating structure 510 may be deposited under a condition at which the void 170 is formed between the recording material layer 530 and the insulating structure 510.

The void 170 may include clean, dry air; however, example embodiments are not limited thereto. The void 170 may be under vacuum; however, example embodiments are not limited thereto. The void 170 may not have moisture; however, example embodiments are not limited thereto.

Figure 13A:
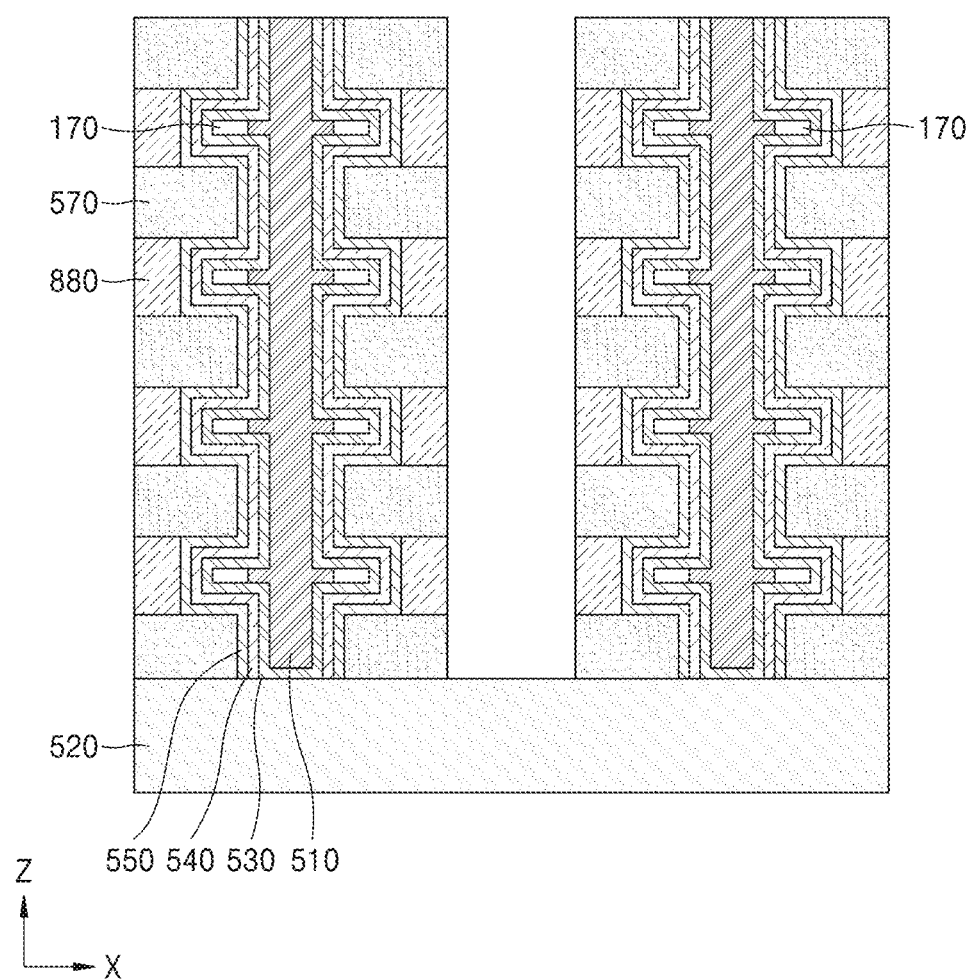
Figure 13B:
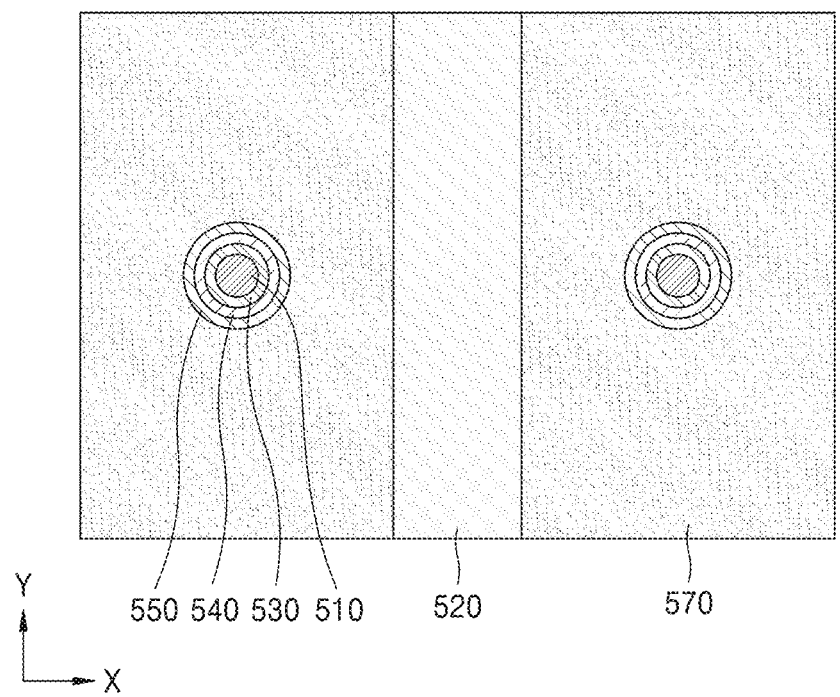

Next, as shown in FIGS. 13A and 13B, the structure of FIG. 12 is etched and cut; e.g. the structure surrounding much of the insulating structure 510 between adjacent insulating structures 510 is removed to expose the substrate 520.

Figure 14A:
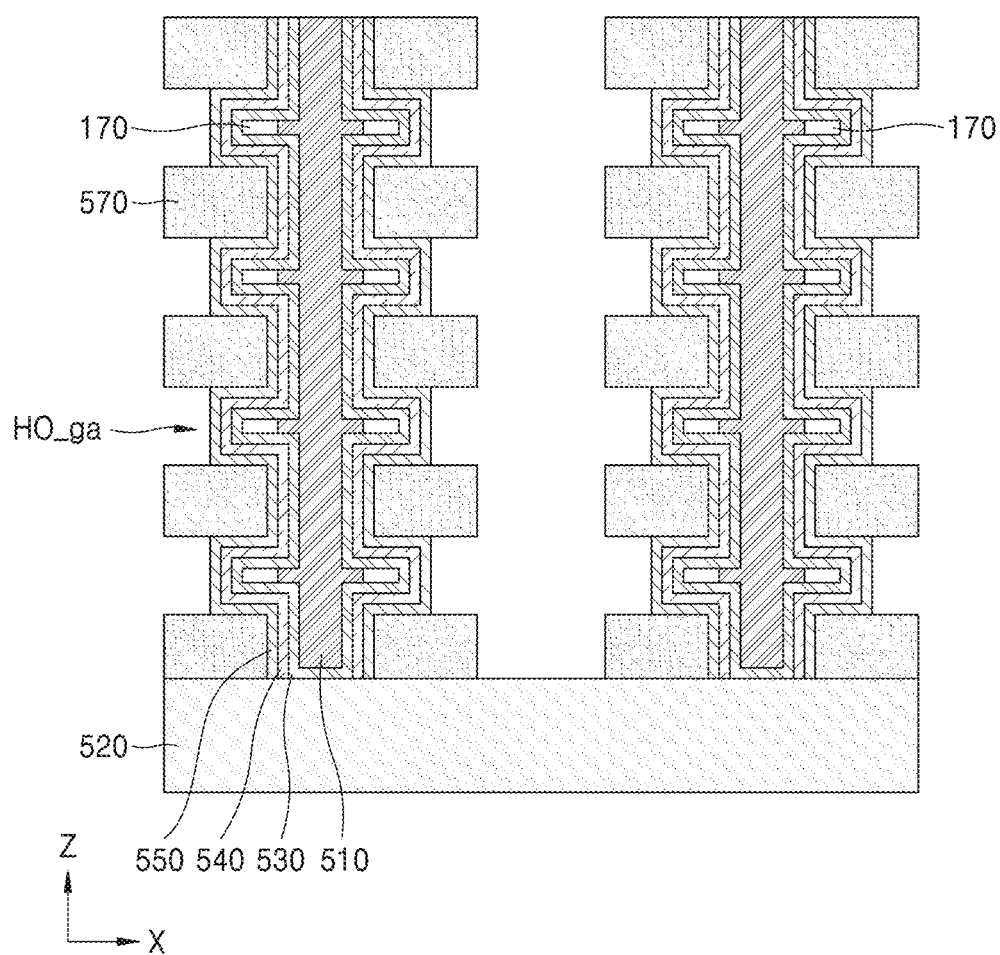
Figure 14B:
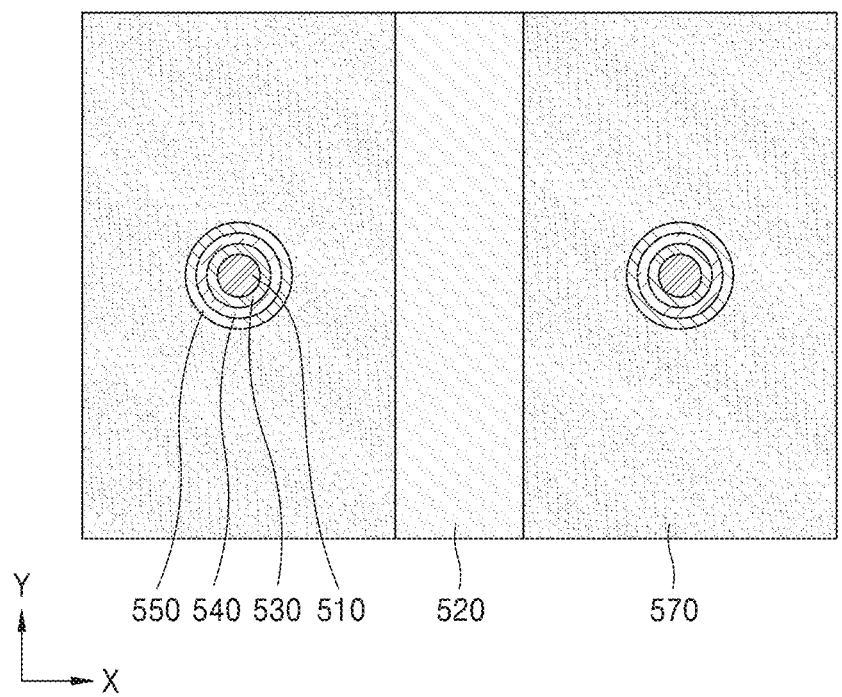
Figure 15A:
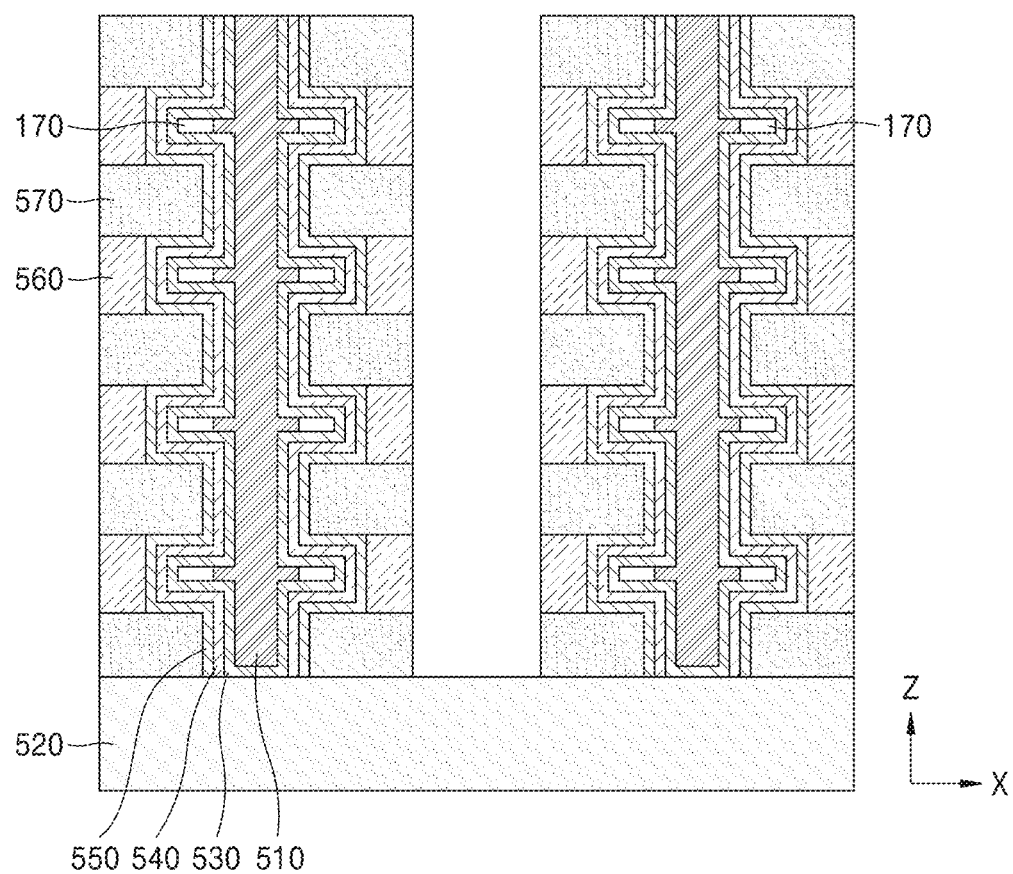
Figure 15B:
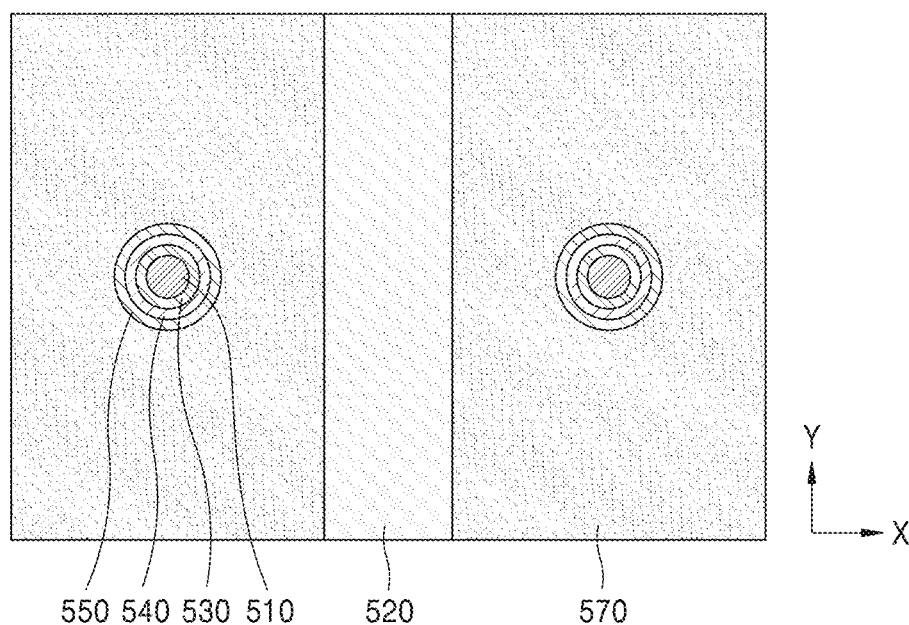

Next, as shown in FIGS. 14A and 14B, a gate hole HO_ga is formed by removing the remaining sacrificial layer 880, and, as shown in FIG. 15A, a gate electrode 560 is formed by depositing an electrode material in the gate hole HO_ga. In this way, two string cells CS are formed on the substrate 520.

Figure 16A:
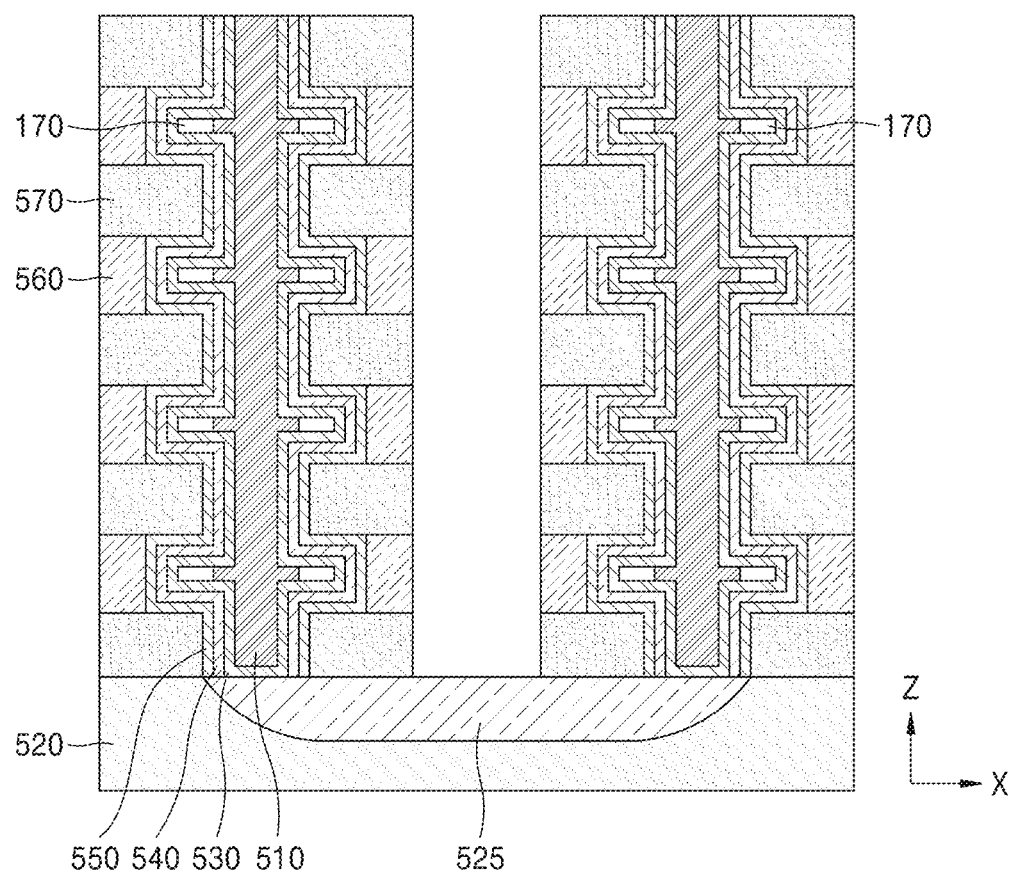
Figure 16B:
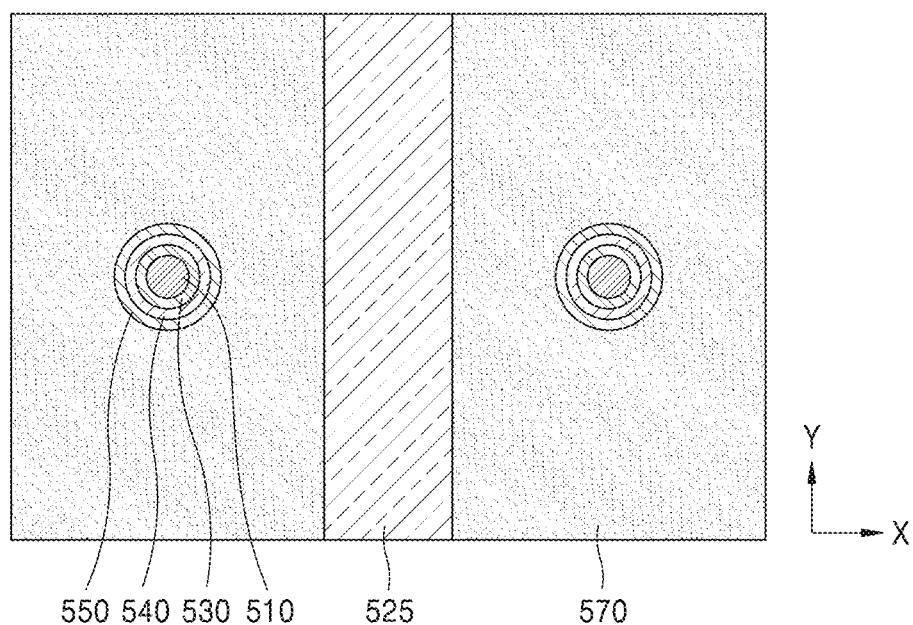

Next, as shown in FIGS. 16A and 16B, a common source region 525 is formed. The formation of the common source region 525 is a process of forming a high dopant concentration region by injecting a dopant into a predetermined region on the substrate 520. The common source region 525 is formed to contact one end of the channel layer 540 and the recording material layer 530 of the two string cells CSs.

Figure 17A:
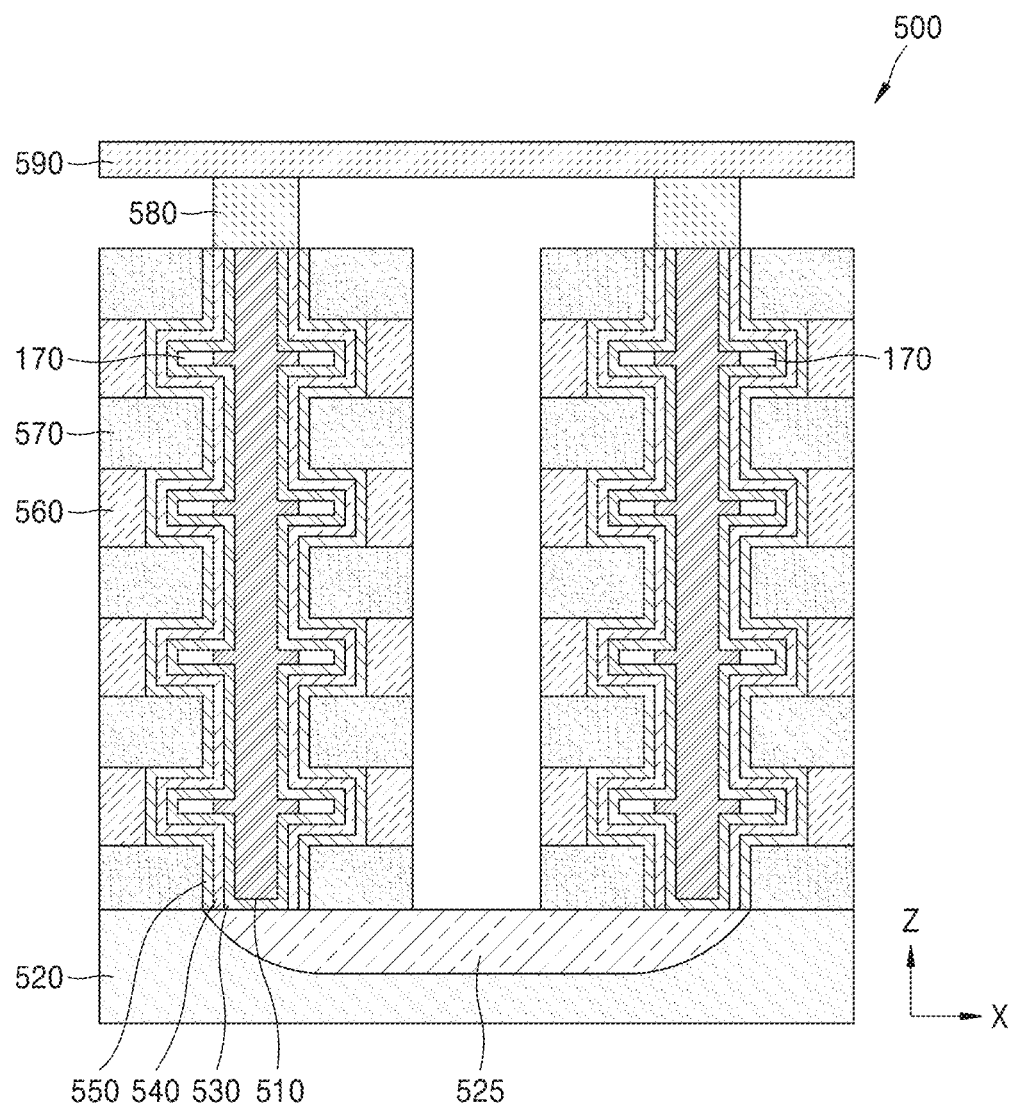
Figure 17B:
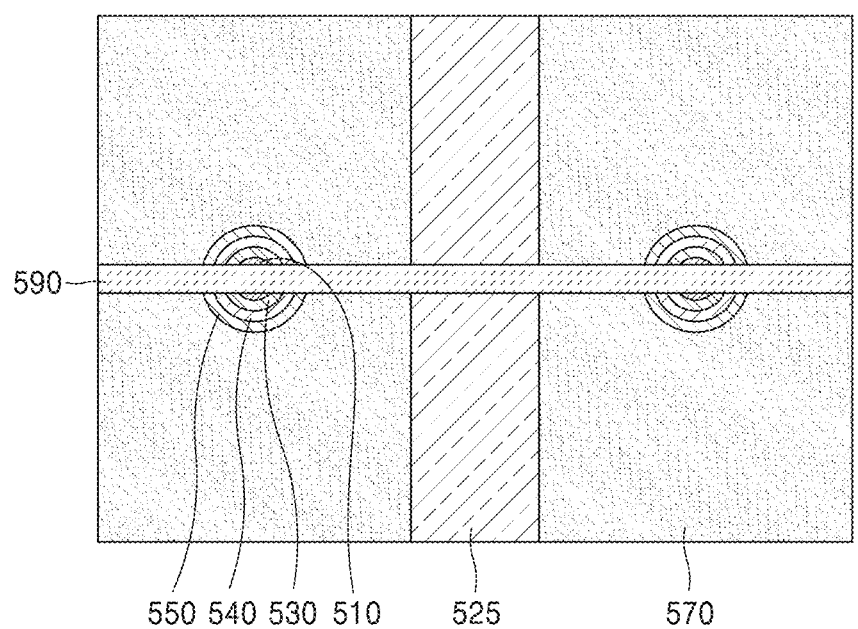

Next, as shown in FIGS. 17A and 17B, drain regions 580 that are connected to the other end of the two string cells CS are formed and a bit line 590 connecting the drain regions 580 is also formed. The other end of the two string cells CS is opposite to the end of the two string cells CS contacting with the common source region 525.

Figure 18:
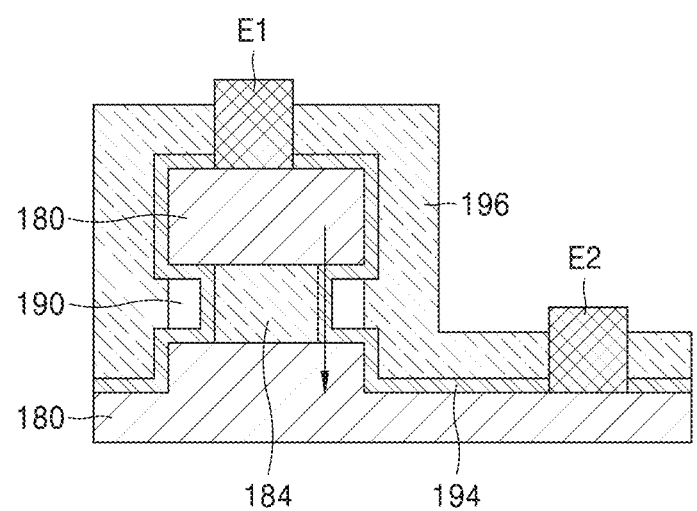
FIG. 18 is a cross-sectional view showing a schematic configuration of a sample fabricated to test a void formation in a memory device according to some example embodiments.

FIG. 18 shows a schematic configuration of a sample memory cell manufactured to confirm whether a void is formed in a manufacturing process of the memory device according to some example embodiments.

FIG. 18 shows a structure in which a $SiO_2$ layer 184 is formed to be recessed between polysilicon layers 180 doped with a high concentration, and a $HfO_2$ layer 194 that includes a variable resistance material is formed on sides thereof, and then, a capping insulating layer ($SiO_2$) 196 covering the whole product is formed, and a void 190 is formed between the $HfO_2$ layer 194 and the capping insulating layer 196 in the recess. When a voltage is applied to upper and lower electrodes (Pt/Ti) E1 and E2, a current flows along a path indicated by an arrow, which simulates a current path in a selected channel of the memory device 200 according to some example embodiments. The capping insulating layer 196 may correspond to the insulating structures 210 and 510. The capping insulating layer 196 may be deposited using a PVD, CVD, evaporator, or PLD method.

Figure 19:
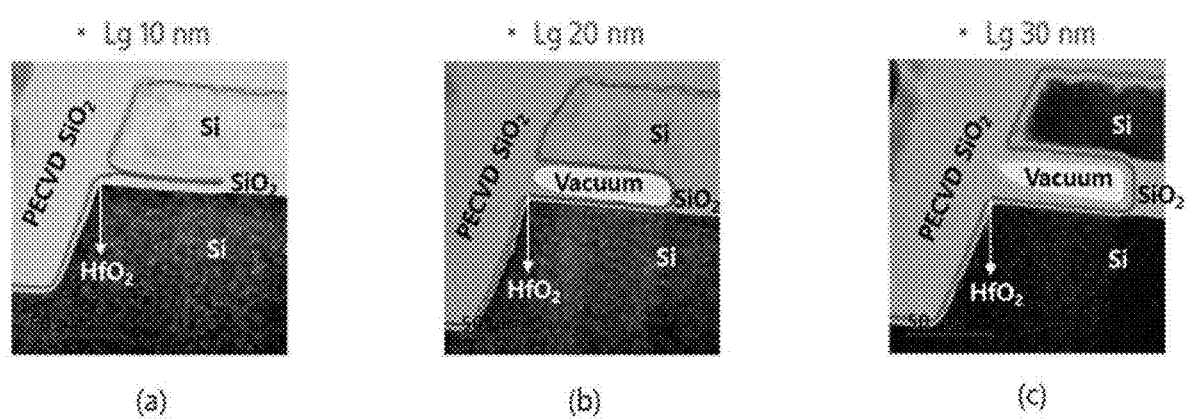
FIG. 19 shows transmission electron microscopy (TEM) images of the sample of FIG. 18.

FIG. 19(a) to (c) show transmission electron microscopy (TEM) micrograph images of a sample of FIG. 18.

FIG. 19(a) shows a result when the thickness of the $SiO_2$ layer 184 is 10 nm, and as the recess region is narrow to 10 nm, reactive gases, such as $O_3$, may stay for a long time in the narrow recess region when $HfO_2$ is deposited, and thus, the $SiO_2$ layer 184 is thickly formed under the $HfO_2$ layer 194, and the intended void may not be formed.

FIG. 19(b) shows a result when the thickness of the $SiO_2$ layer 184 is 20 nm, and shows that an intended void (a region indicated as Vacuum) is formed between the $HfO_2$ layer 194 and the capping insulating layer 196 in the recess region.

FIG. 19(c) shows a result when the thickness of the $SiO_2$ layer 184 is 30 nm, and although a void is formed, it shows that the capping insulating layer 196 invades between the void and the SiO$_2$ layer 184 as the recess region is widened. There may be bread-loafing of the capping insulating layer (SiO$_2$) 196 referred to as PECVD SiO$_2$ to create the void labelled vacuum; however, example embodiments are not limited thereto.

These results show that the thickness of the SiO$_2$ layer 184 should be optimized or improved to form a void in the recess region.

The memory devices 200 and 500 according to the present disclosure may be employed as a memory system of various electronic apparatuses. The memory device 500 may be embodied as a chip-shaped memory block and may be used as a neuromorphic computing platform or used to configure a neural network.

Figure 20:
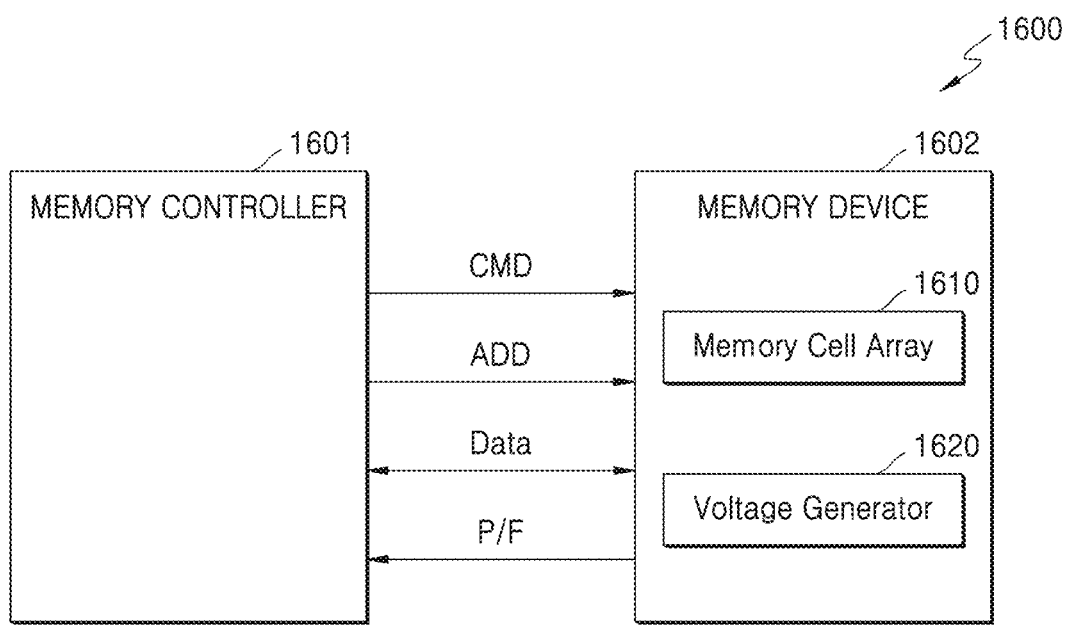
FIG. 20 is a block diagram of a memory system according to some example embodiments.

FIG. 20 is a block diagram of a memory system according to some example embodiments.

Referring to FIG. 20, the memory system 1600 may include a memory controller 1601 and a memory device 1602. The memory controller 1601 performs a control operation on the memory device 1602, for example, the memory controller 1601 provides an address ADD to the memory device 1602 and a command CMD for programming (or writing), reading, and/or erasing with respect to the memory device 1602. In addition, data for programming operations and read data may be transferred between the memory controller 1601 and the memory device 1602. The memory system 1600 may include at least one other active or passive circuit element, such as at least one other transistor or resistor, in addition to the memory device 1602.

The memory device 1602 may include a memory cell array 1610 and a voltage generator 1620. The memory cell array 1610 may include a plurality of memory cells arranged in a region where a plurality of word lines and a plurality of bit lines cross each other. The memory cell array 1610 may include a memory device based on the embodiments of FIGS. 1, 4, and 5.

The memory controller 1601 may include a processing circuit, such as hardware including a logic circuit; a combination of hardware/software, such as processor execution software; or a combination thereof. For example, more specifically, the processing circuit may be or may include a central processing unit (CPU), an arithmetic logic device (ALU), a digital signal processor, a microcomputer, a field programmable gate array (FPGA), a system-on-chip (SOC), a programmable logic unit, a microprocessor, an application-specific integrated circuit (ASIC), etc., but are not limited thereto. The memory controller 1601 may be configured to operate in response to a request from a host (not shown), and to convert the memory controller 1601 to a special purpose controller by accessing to the memory device 1602 and controlling the control operation (e.g., write/read operations). The memory controller 1601 may generate an address ADD and a command CMD for performing a programming/read/erase operation with respect to the memory cell array 1610. In addition, in response to an instruction from the memory controller 1601, the voltage generator 1620 (e.g., the power circuit) may generate a voltage control signal for controlling a voltage level of a word line for data programming or data reading to the memory cell array 1610.

In addition, the memory controller 1601 may perform a determination operation with respect to data read from the non-volatile memory device 1602. For example, from the data read from a memory cell, the number of on-cells and/or off-cells may be determined. The memory device 1602 may provide a pass/fail signal P/F to the memory controller 1601 according to a result of reading the read data. The memory controller 1601 may control write and read operations of the memory cell array 1610 with reference to the pass/fail signal P/F.

Figure 21:
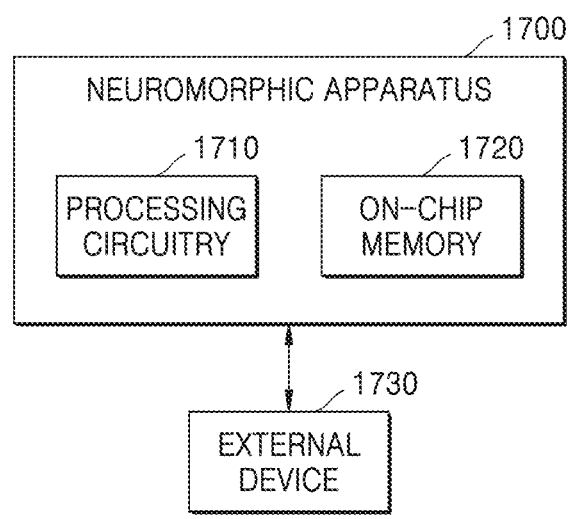
FIG. 21 is a block diagram showing a neuromorphic apparatus according to some example embodiments and an external device connected thereto.

FIG. 21 is a block diagram showing a neuromorphic apparatus 1700 according to some example embodiments and an external device connected thereto.

Referring to FIG. 21, the neuromorphic apparatus 1700 may include a processing circuit 1710 and/or an on-chip memory 1720. The neuromorphic apparatus 1700 may include a memory device based on the embodiments of FIGS. 1, 4 and 5.

In some embodiments, the processing circuit 1710 may be configured to control functions for driving the neuromorphic apparatus 1700. For example, the processing circuit 1710 may be configured to control the neuromorphic apparatus 1700 by executing a program stored in the memory 1720. In some example embodiments, the processing circuit 1710 may include hardware, such as a logic circuit, a combination of hardware/software, such as a processor executing software, or a combination thereof. For example, the processor may include a CPU, a graphic processing unit (GPU), an application processor (AP) included in the neuromorphic apparatus 1700, an ALU, a digital signal processor, a microcomputer, an FPGA, a SOC, a programmable logic unit, a microprocessor, an ASIC, etc., but example embodiments are not limited thereto. In some embodiments, the processing circuit 1710 may be configured to read/write various data with respect to the external device 1730 and/or execute the neuromorphic device 1700 by using the read/write data. In some embodiments, the external device 1730 may include an external memory and/or a sensor array having an image sensor (e.g., a CMOS image sensor circuit).

In some example embodiments, the neuromorphic apparatus 1700 of FIG. 21 may be applied to a machine learning system. The machine learning system may use various artificial neural networks and processing models, such as a convolutional neural network (CNN), a deconvolutional neural network, a repetitive neural network optionally including a long short-term memory (LSTM) unit and/or a gated recurrent unit (GRU), a stacked neural network (SNN), a state-space dynamic neural network (SSDNN), a deep faith network (DBN), a generative adversarial network (GAN) and/or a restricted boltzmann machine (RBM).

Alternatively or additionally, the machine learning systems may include other types of machine learning models, for example, linear and/or logistic regression, statistics clustering, Bayesian classification, determination trees, dimensional reduction such as main component analyses, and/or a combination thereof including an ensemble, such as random forests. The machine learning models may be used to provide various services and/or applications. For example, an image classification service, a user authentication service based on biometric information or biometric data, an advanced driver assistance system (ADAS) service, a voice assistant service, an automatic speech recognition (ASR) service, etc. may be executed by an electronic device.

Figure 22:
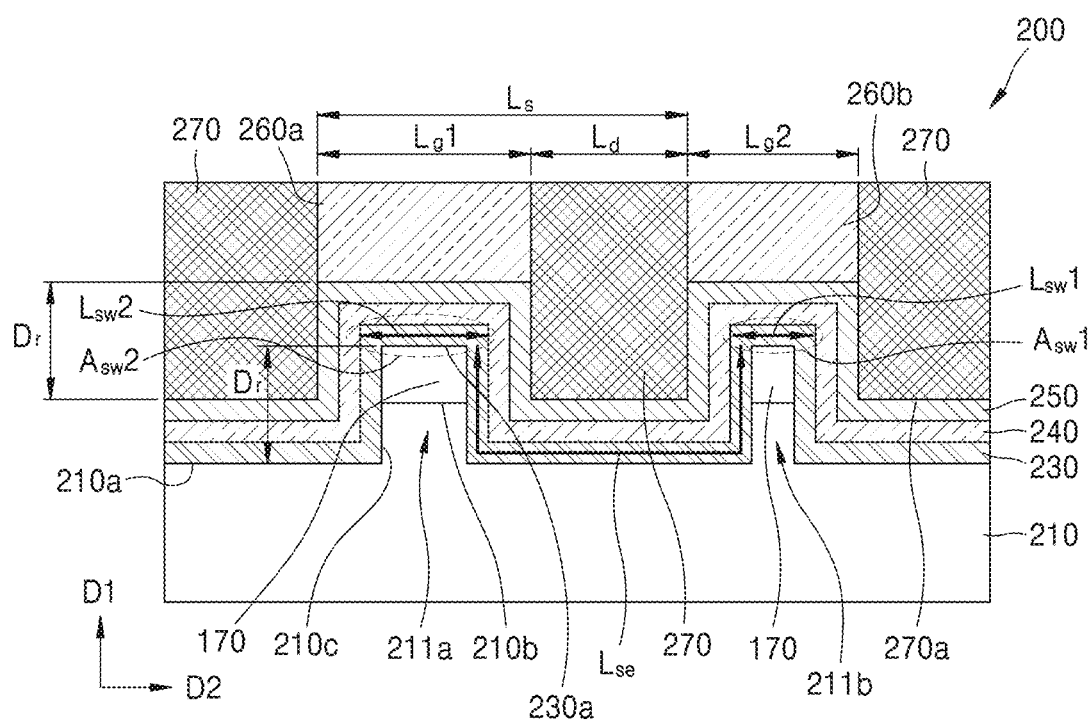
FIG. 22 is a schematic cross-sectional view showing a structure of a memory device according to some example embodiments.

FIG. 22 is a schematic cross-sectional view showing a structure of a memory device according to some example embodiments. Descriptions of features to other figures will be omitted for brevity.

Referring to FIG. 22, a memory device 200 includes an insulating structure 210, a recording material layer 230, a channel layer 240, a gate insulating layer 250 sequentially formed on the insulating structure 210, a first gate electrode 260*a* on the gate insulating layer 250, and a second gate electrode 260*b* on the gate insulating layer 250. The memory device also includes a separating layer 270 provided between adjacent two gate electrodes 260. The insulating structure 210 has a shape having a first protrusion portion 211a protruding to a variably determined or predetermined distance in a first direction (D1 direction) from a first surface 210a, and a second protrusion portion 211b protruding to a variably determined or predetermined distance in the first direction (D1 direction) from the first surface 210a.

A length of the first gate electrode 260a in a second direction (D2 direction) is $L_{g1}$, and a length of the second gate electrode 260b in the second direction (D2 direction) is $L_{g2}$, which may be different from $L_{g1}$. Similarly, a length $L_{sw1}$ of a first switching region $A_{sw1}$ may be different from a length $L_{sw2}$ of a second switching region $A_{sw2}$.

The length $L_{g1}$ of the first gate electrode may be between 10 nm and 50 nm, e.g. about 30 nm, and the length $L_{g2}$ may be about 5 nm to about 15 nm smaller than the length $L_{g1}$; however, example embodiments are not limited thereto.

The lengths $L_{g1}$ and $L_{g2}$ may be determined during the fabrication of the semiconductor device 200. For example, the lengths $L_{g1}$ and $L_{g2}$ may be determined by the process conditions used during a process step of depositing gate electrodes 560 and separating layers 570 (refer to FIG. 8A); however, example embodiments are not limited thereto.

As described above, in the memory device according to some example embodiments, a void exists between a recording material layer (resistance change layer) adjacent to a gate electrode and an insulating structure layer. Due to such voids, direct contact between the recording material layer and the insulating structure layer is prevented or reduced in likelihood of occurrence, and thus, the deterioration of the resistance change characteristic, for example, the switching characteristic of the recording material layer may be prevented. As a result, a stable switching performance may be obtained and a low power driving is possible. In addition, in the memory device, because an electrical separation distance between adjacent memory cells may be formed greater than a physical separation distance, the degree of integration density may be effectively increased.

Any of the elements disclosed above may include and/or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

It should be understood that embodiments described herein should be considered in a descriptive sense only and not for purposes of limitation. Descriptions of features or aspects within each embodiment should typically be considered as available for other similar features or aspects in other embodiments. While one or more example embodiments have been described with reference to the figures, it will be understood by those of ordinary skill in the art that various changes in form and details may be made therein without departing from the spirit and scope as defined by the following claims. Furthermore none of the example embodiments are necessarily mutually exclusive to one another. For example, some example embodiments may include features described with reference to one or more figures, and may also include other features described with reference to one or more other figures.

What is claimed is:

1. A memory device comprising:
an insulating structure having a shape that includes a first surface and a protrusion portion protruding from the first surface in a first direction;
a recording material layer covering the protrusion portion along a protruding shape of the protrusion portion and extending to the first surface on the insulating structure;
a channel layer on the recording material layer along a surface of the recording material layer;
a gate insulating layer on the channel layer; and
a gate electrode on the gate insulating layer, the gate electrode at a location facing a second surface, the second surface being an upper surface of the protrusion portion,
wherein the insulating structure and the recording material layer define a void, the void between the gate electrode and the insulating structure.

2. The memory device of claim 1,
wherein a length from the first surface to the second surface in the first direction is about 5 nm or more.

3. The memory device of claim 1,
wherein the first surface and the second surface are parallel to each other.

4. The memory device of claim 1,
wherein the recording material layer comprises a variable resistance material.

5. The memory device of claim 4,
wherein the recording material layer comprises at least one of $Rb_2O$, $TiO_2$, $BaO$, $ZrO_2$, $CaO$, $HfO_2$, $SrO$, $Sc_2O_3$, $MgO$, $Li_2O$, $Al_2O_3$, $SiO_2$, $BeO$, $Sc_2O_3$, $Nb_2O_5$, $NiO$, $Ta_2O_5$, $WO_3$, $V_2O_5$, $La_2O_3$, $Gd_2O_3$, $CuO$, $MoO_3$, $Cr_2O_3$, and $MnO_2$.

6. The memory device of claim 1,
wherein the recording material layer comprises a phase change material.

7. The memory device of claim 6,
wherein the recording material layer comprises $Ge_2Sb_2Te_5$.

8. The memory device of claim 1,
wherein the recording material layer has a thickness in a range from about 0.5 nm to about 30 nm.

9. The memory device of claim 1,
wherein the protrusion portion includes a plurality of protrusions that are at constant intervals in a second direction perpendicular to the first direction, and a plurality of gate electrodes are on the insulating structure, and
wherein the gate electrode is one of the plurality of gate electrodes, the plurality of gate electrodes face the plurality of protrusions, respectively, and are apart from each other in the second direction.

10. The memory device of claim 9,
wherein a length of the gate electrode in the second direction is in a range from about 5 nm to about 30 nm.

11. The memory device of claim 9,
wherein a distance between adjacent gate electrodes among the plurality of gate electrodes is in a range from about 5 nm to about 30 nm.

12. The memory device of claim 9, further comprising:
a separating layer between the plurality of gate electrodes.

13. The memory device of claim 9,
wherein a region of the recording material layer includes a plurality of switching regions each facing the plurality of gate electrodes having two ends, each of the plurality of switching regions have both ends in the second direction, and the both ends of the plurality of switching regions each contact the channel layer.

14. The memory device of claim 13,
wherein an electrical separation distance between adjacent switching regions among the plurality of switching regions is greater than a physical separation distance between the adjacent switching regions.

15. The memory device of claim 14,
wherein when a sum of a protrusion length of the protrusion portion and a length of the void in a direction of the protrusion portion is $D_r$, the electrical separation distance is greater than the physical separation distance by $2D_r$.

16. The memory device of claim 14,
wherein a length of the switching region in the second direction is less than a length of the gate electrode in the second direction.

17. The memory device of claim 9,
wherein the insulating structure has a shape in which the plurality of protrusions surround a cylindrical surface of a cylinder with a width and protrude in a radial direction on the cylindrical surface of the cylinder, wherein a length direction of the cylinder is the second direction.

18. The memory device of claim 17,
wherein one of both ends of the recording material layer and the channel layer in the second direction connects to a common source line, the other end connects to a bit line, and the plurality of gate electrodes connect to a plurality of word lines, respectively.

19. The memory device of claim 1,
wherein the insulating structure exists only at one end of the recording material layer without the protrusion portion, and the void extends to an entire inner region surrounded by the recording material layer.

20. An electronic device, comprising:
the memory device of claim 1; and
at least one active or passive circuit.

* * * * *